United States Patent [19]
Fujiyama et al.

[11] Patent Number: 6,058,945
[45] Date of Patent: May 9, 2000

[54] CLEANING METHODS OF POROUS SURFACE AND SEMICONDUCTOR SURFACE

[75] Inventors: Yasutomo Fujiyama, Atsugi; Hideya Kumomi, Yokohama, both of Japan

[73] Assignee: Canon Kabushiki Kaisha, Tokyo, Japan

[21] Appl. No.: 08/922,454

[22] Filed: Sep. 3, 1997

Related U.S. Application Data

[63] Continuation-in-part of application No. 08/864,731, May 28, 1997, abandoned.

[30] Foreign Application Priority Data

| May 28, 1996 | [JP] | Japan | 8-157632 |
| Jun. 5, 1996 | [JP] | Japan | 8-142836 |
| Jun. 5, 1996 | [JP] | Japan | 8-142837 |

[51] Int. Cl.$^7$ ................................................. B08R 7/00
[52] U.S. Cl. ..................... 134/1.3; 134/1; 134/26; 134/86; 134/902; 134/28
[58] Field of Search ........................ 134/1, 1.3, 902, 134/86, 2, 3, 26, 28, 29, 32, 33, 34, 22.1, 22.18, 23; 438/906

[56] References Cited

U.S. PATENT DOCUMENTS

| 3,893,869 | 7/1975 | Mayer et al. ................................. 134/1 |
| 4,927,781 | 5/1990 | Miller . | |
| 5,331,180 | 7/1994 | Yamada et al. ............................. 257/3 |
| 5,372,962 | 12/1994 | Hirota et al. . | |
| 5,427,977 | 6/1995 | Yamada .................................. 437/127 |
| 5,510,633 | 4/1996 | Orlowski et al. ......................... 257/93 |
| 5,626,159 | 5/1997 | Erk et al. ............................. 134/902 X |

FOREIGN PATENT DOCUMENTS

| 0502237 | 9/1992 | European Pat. Off. . |
| 0572211 | 12/1993 | European Pat. Off. . |

OTHER PUBLICATIONS

Handbook of Semiconductor Wafer Cleaning Technology, Noyes Publications, pp. 48–56, 76–85, 134–142, 390–394 and 597–598, 1993.

S. Ojima et al., "Advanced Wet Cleaning of Wafers with Reduced Chemicals and DI Water Consumption", research report IEICE, SDM 95–86, ICD 95–95, pp. 105–112, Jul. 1995.

M. Morita and T. Ohmi, "Current Understanding of the Native Oxides", abstract, Ultra Clean Technology, vol. 1, No. 1, pp. 22–28, 1989.

T. Yonehara et al., "Epitaxial layer transfer by bond and etch back of porous Si," *Applied Physics Letters* 64 (16), Apr. 18, 1994.

O.I. Babikov, "Ultrasonic Modular Units for Cleaning Semiconductor Structures in Deionized Water With Increased Intensity of the Piezoceramic Transducers", *Elektrotekhnika,* vol. 62, No. 6, pp. 74–77, 1991.

Patent Abstracts of Japan, vol. 15, No. 130 (E–1051), Mar. 29, 1991, corresponding to JP 03–014230.

Patent Abstracts of Japan, vol. 12, No. 049 (E–582), Feb. 13, 1988, corresponding to JP 62–198127.

Patent Abstracts of Japan, vol. 18, No. 651 (C–1285), Dec. 9, 1994, corresponding to JP 06–254521.

Patent Abstracts of Japan, vol. 16, No. 465 (E–1270), Sep. 28, 1992, corresponding to JP 04–165620.

Patent Abstracts of Japan, vol. 16, No. 420 (E–1259), Sep. 4, 1992, corresponding to JP 04–144131.

Patent Abstracts of Japan, vol. 18, No. 684 (E–1650), Dec. 22, 1994, corresponding to JP 06–275866.

Patent Abstracts of Japan, vol. 18, No. 493 (E–1606), Sep. 14, 1994, corresponding to JP 06–168660.

*Primary Examiner*—Jill Warden
*Assistant Examiner*—Alexander Markoff
*Attorney, Agent, or Firm*—Fitzpatrick, Cella, Harper & Scinto

[57] ABSTRACT

Provided is a suitable cleaning method of a porous semiconductor substrate without collapse of the porous structure due to cavitation or resonance. In a cleaning method of a porous surface of a semiconductor substrate having the porous structure at least in the surface, cleaning for removing dust particles adhering to the porous surface of the substrate takes place with pure water on which a high-frequency wave with a frequency in the range of from 600 kHz to 2 MHz is superimposed.

9 Claims, 23 Drawing Sheets

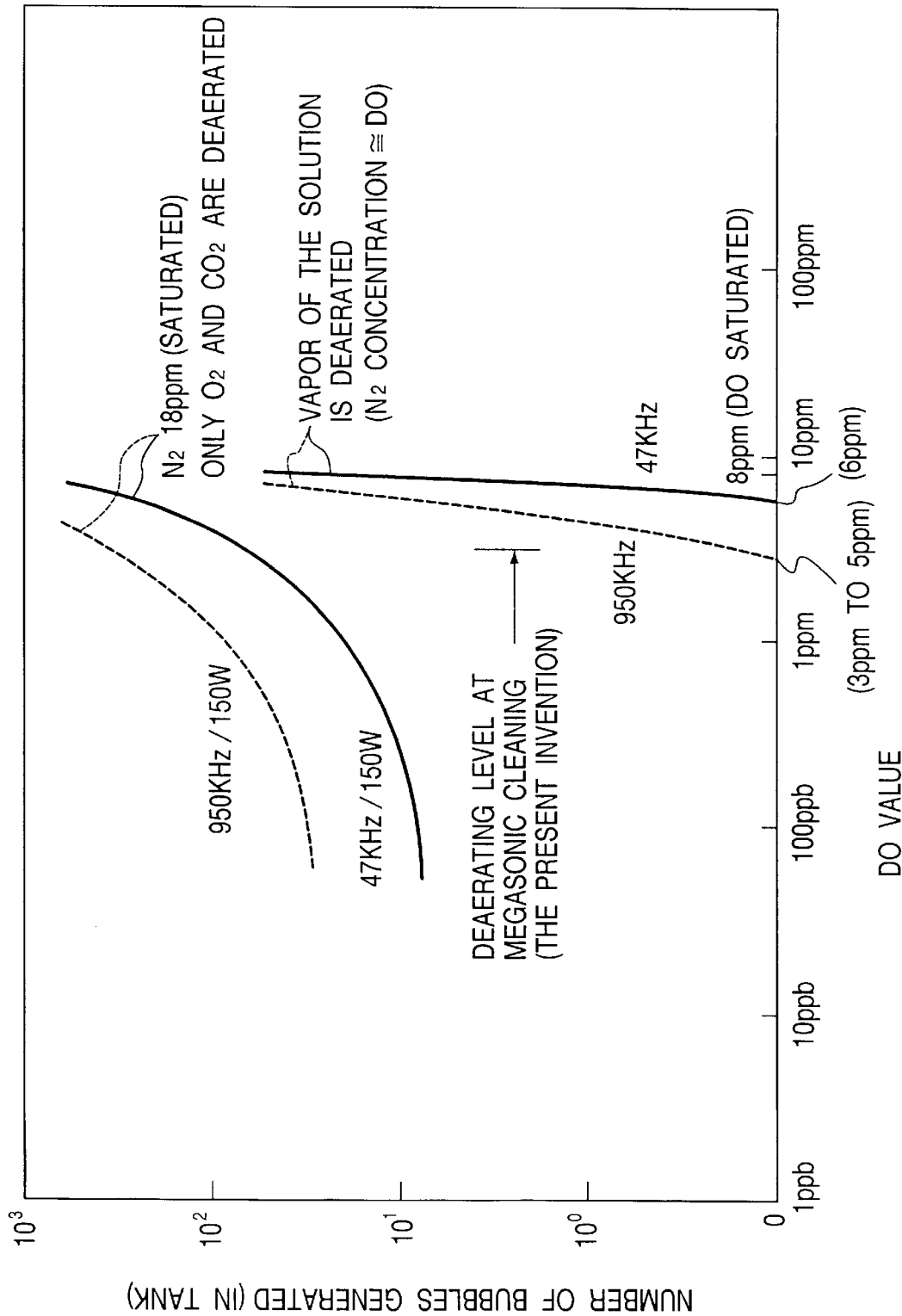

PARTICLE OF 0.3μm OR MORE

CLEANING METHODS OF POROUS SURFACE AND SEMICONDUCTOR SURFACE

This is a continuation-in-part of U.S. patent application Ser. No. 08/864,731 filed on May 28, 1997, now abandoned.

BACKGROUND OF THE INVENTION

1. Field of the Invention

The present invention relates to a cleaning method for cleaning a substrate having a porous structure in the surface thereof and, more particularly, to a cleaning method of porous surface. The present invention is suitably applicable as a cleaning method for cleaning a porous silicon semiconductor substrate used for selective etching or dielectric isolation of a semiconductor or used as a light emitting material, which demands the most strict control of cleanliness. The invention also relates to a cleaning method of a semiconductor surface.

2. Related Background Art

The method for forming the porous structure typified by porous silicon was introduced by A. Uhlir in 1956 (Bell. Syst. Tech. J., 35, pp. 333).

After that, application technologies were developed including use thereof as a selective etching layer or as an isolation area after oxidized, epitaxial growth on porous silicon, etc. The present applicant disclosed in Japanese Laid-Open Patent Application No. 5-21338 that an SOI (Silicon on Insulator) substrate was fabricated using a single-crystal silicon thin film epitaxially grown on porous silicon.

In recent years, the photoluminescence phenomenon of porous silicon was discovered. It is since drawing attention as a self-radiative material utilizing not only its structural features but also its physical properties.

A popular method for forming porous silicon is anodization in an electrolyte solution of a mixture of hydrofluoric acid/pure water/ethanol by the conventional electrochemical cell structure. Since many dust particles adhere to this porous silicon, it is better to remove the dust particles by cleaning before epitaxial growth on the porous silicon. Conventional cleaning comprises only rinsing the above electrolyte solution inside pores with pure water. There is no example of introducing a positive cleaning method of the surface.

It is well known that, cleaning is indispensable before and after processing in the semiconductor processes and that it is also unavoidable in the case of the porous silicon substrate. The conventional cleaning methods of bulk substrate (non-porous substrate) include chemical wet cleaning with a combination of chemicals such as sulfuric acid/hydrogen peroxide, ammonia/hydrogen peroxide, hydrochloric acid/hydrogen peroxide, or hydrofluoric acid/pure water, as typified by RCA cleaning (RCA Review, 31, pp. 187–205, 1970) developed by W. Kern et al., which is said to be a method effective for removal of dust particles on the surface.

Recently, Ojima et al. (Research Report, Institute of Electronics, Information and Communication Engineers, SDM95-86, ICD95-95, pp. 105–112, July 1995) proposed a method for removing the dust particles by applying a high-frequency ultrasonic wave of about 1 MHz (megasonic wave) to the bulk substrate in a mixture of hydrofluoric acid/hydrogen peroxide/pure water/surfactant or in ozone-added pure water, for the purpose of decreasing amounts of cleaning chemicals.

This method is characterized by cleaning conducted in such a way that the silicon substrate is oxidized with hydrofluoric acid and hydrogen peroxide to be etched, the dust particles on the surface are lifted off from the substrate, and potentials of the dust particles are neutralized with the surfactant to prevent re-deposition of dust particles on the substrate. The purpose of this method is to give energy upon the lift-off of dust particles and to remove organic matter attached to the surface of substrate by generation of ions from the pure water by megasonic wave application. Thus, the basis of the cleaning is chemical cleaning. Use of the ozone pure water is for the purpose of enhancing the organic removing effect.

In ultrasonic cleaning, cleaning with low frequencies ranging approximately from several ten kHz to 400 kHz conventionally used is "liquid resonance cleaning" to remove the dust particles of several ten pm on the substrate surface by applying a strong shock wave to the substrate surface by liquid cavitation (expansion/compaction) due to the liquid resonance action. In contrast, cleaning with high frequencies ranging from 800 kHz to 1.6 MHz is "sound-wave scrub cleaning" to remove the dust particles by giving kinetic energy based on resonance to the dust particles, which enables the removal of dust particles of submicron order without damaging fine patterns.

Low-frequency cleaning causes damage to fine patterns due to the cavitation impact and is no longer used in the semiconductor processes of 4-Mbit DRAM and processes. On the other hand, high-frequency cleaning is recognition as a method capable of cleaning fine dust particles without damaging the patterns.

According to the experience of the present inventors, the substrate having the surface of the porous structure is of fine and dense structure and has long pores. Therefore, use of chemicals in conventional chemical wet cleaning causes the chemicals to intrude deeply into the pores, which makes complete elimination of chemicals difficult even with rinsing with pure water for a long time. It negatively affects the post-processes like the epitaxial growth on the porous structure.

If the physical removal of dust particles is attempted by superposing the conventional ultrasonic of low frequency on pure water, the fragile will raise the porous structure will raise the may collapse due to the sound pressure of shock wave of cavitation even in the relatively high frequency region around 200 kHz.

This problem results from the structure of porous silicon, and the experience of the present inventors is not peculiar. The reason why the positive cleaning of porous silicon surface has not been conducted heretofore is believed to be the above problem.

In addition, it was found by the present inventors that when the surface of the porous silicon substrate was rinsed with pure water after formation of the porous structure by anodization, several hundred dust particles not less than 0.3 $\mu$m, obtained from laser reflection intensity distribution, adhered to the surface in a 5-inch-diameter wafer as shown in FIG. 28. In the bar graph, classification of L1, L2, and L3 indicates rough classification of sizes of dust particles obtained from laser reflection intensities from the dust particles, and the sizes increase in the order of L1<L2<L3.

The number of dust particles adhering upon anodization gradually decreases with increasing number of batch of anodization in the single wafer process as shown in FIG. 28, because the dust particles in the liquid decrease as captured by the substrate. Such high numbers are, however, anomalous numbers when compared with those in the current semiconductor processes, wherein the dust particles are removed down to several or less particles on the surface of a bulk substrate after RCA-cleaning.

These dust particles adhering during anodization can be decreased to some extent by liquid circulation of the above electrolyte solution and collection of dust particles with a filter, but the decrease is not sufficient yet. Conceivable causes of adhesion of dust particles include dust particles mixed in an anodization system and in the electrolyte solution and dust generated from workers during the process. Further, it is also conceivable that the surface of porous silicon becomes hydrophobic because of the anodization in the high-concentration hydrofluoric acid electrolyte, so that the silicon substrate tends to be electrostatically charged, thereby attracting the dust particles. Therefore, prevention of adhesion of the dust particles is not easy.

As a matter of course, such dust particles the generate imperfections in the subsequent processes, such as anomalous growth or pinholes in the film-forming process, and were problematic in applications of porous silicon.

SUMMARY OF THE INVENTION

An object of the present invention is, therefore, to provide a new cleaning method capable of efficiently removing the dust particles adhering to such a porous silicon surface without using chemicals that might affect the subsequent processes and without causing collapse of the porous silicon surface.

A further object of the present invention is to provide an efficient and economical cleaning method that can be introduced readily without a need for great change of the conventional cleaning steps and that does not have to use special chemicals.

A first cleaning method of a porous surface according to the present invention is a method for cleaning a porous surface of a substrate having the porous structure at least in the sur face thereof, wherein cleaning for removing dust particles adhering to the porous surface of the substrate takes place with pure water on which a high-frequency wave with a frequency in the range of from 600 kHz to 2 MHz is superimposed.

A second cleaning method of a porous surface according to the present invention is the above first cleaning method of a porous surface wherein the substrate surface to be cleaned has such structure that apertures of many pores are exposed and wherein internal wall surfaces of the pores are of such structure that a material of the porous structure is exposed or is covered with a material of a different kind. The material of the different kind is a material different from the material of the porous structure, and it may be a film deposited on the surface of the material of the porous structure or a film formed by processing the material of the porous structure by oxidation, nitridation or the like. The material is selected as the occasion may demand.

The cleaning method of a porous surface according to the present invention can clean the substrate by immersing it in a pure water bath and superimposing the high-frequency wave thereon.

The cleaning method of a porous surface according to the present invention can clean the substrate by superimposing the high-frequency wave in parallel to the porous surface of the substrate immersed in the pure water bath.

The cleaning method of a porous surface according to the present invention can intermittently lift the substrate under high-frequency cleaning as immersed in the pure water bath out of the liquid.

The cleaning method of a porous surface according to the present invention can clean the substrate by blowing a pure water shower of the pure water on which the high-frequency wave is superimposed against the porous surface of the substrate while rotating the substrate.

The porous structure in the present application means a structure in which a porous structure, comprised of many fine communicating holes, the pore sizes and wall thicknesses between the pores of which range approximately from several hundred angstroms to several ten $\mu$m, is formed across the thickness of from several $\mu$m to several hundred $\mu$m in the surface of the substrate.

A cleaning method of a semiconductor surface according to the present invention is characterized in that cleaning for removing dust particles adhering to a surface of a semiconductor substrate takes place with pure water from which dissolved gas is deaerated until a concentration thereof becomes 5 ppm or less and on which an ultrasonic wave is superimposed.

A third cleaning method of a porous surface according to the present invention is a method for cleaning a porous surface of a semiconductor substrate having the porous structure at least in the surface thereof, wherein cleaning for removing dust particles adhering to the porous surface of the substrate takes place with pure water on which a high-frequency ultrasonic wave with a frequency in the range of from 600 kHz to 2 MHz is superimposed and from which dissolved gas is deaerated until a concentration thereof becomes 5 ppm or less.

A fourth cleaning method of a porous surface according to the present invention is the above third cleaning method of a porous surface wherein the substrate surface to be cleaned has such structure that apertures of many pores are exposed and wherein internal wall surfaces of the pores have such structure that a material of the porous structure is exposed or is covered with a material of a different kind. The material of the different kind is a material different from the material of the porous substrate and may be a film deposited on the surface of the material of the porous structure or a film formed by processing the material of the porous structure by oxidation, nitridation or the like.

The cleaning method according to the present invention can clean the substrate by immersing the substrate in a pure water bath having the pure water from which the dissolved gas is deaerated until the concentration thereof becomes 5 ppm or less and superimposing the high-frequency ultrasonic wave thereon.

The cleaning method of a porous surface according to the present invention can also clean the substrate by blowing a pure water shower from which the dissolved gas is deaerated until the concentration thereof becomes 5 ppm or less and on which the high-frequency ultrasonic wave is superimposed, against the porous surface of the substrate while rotating the substrate.

A fifth cleaning method of a porous surface according to the present invention is a method for cleaning a porous surface of a substrate having a porous structure at least in the surface thereof, wherein the porous surface of the substrate is processed so as to be made hydrophilic and cleaning of the hydrophilic porous surface is accomplished with pure water on which a high-frequency ultrasonic wave with a frequency in the range of from 600 kHz to 2 MHz is superimposed, thereby effecting cleaning for removing dust particles adhering to the surface of the substrate.

The porous substrate to be cleaned in the present invention is of such structure that apertures of the pores are exposed in the surface thereof and of such structure as to have the pore structure communicating with the apertures in the surface.

The dust particles to be removed in the present invention are desirably those adhering to the surface of the porous substrate, and sizes thereof are desirably greater than the diameters of the apertures of the pores in the porous structure.

A sixth cleaning method of a porous surface according to the present invention is a method for cleaning a porous surface of a semiconductor substrate having the porous structure at least in the surface thereof, wherein removal of dust particles adhering to the surface of the substrate takes place by processing the porous surface of the substrate so as to make it hydrophilic and superimposing a high-frequency ultrasonic wave with a frequency in the range of from 600 kHz to 2 MHz on a liquid for cleaning the hydrophilic porous surface.

In the cleaning method of a porous surface according to the present invention, the hydrophilic process of the porous surface may be a process for forming an oxide film over the substrate surface and over the internal walls of pores in the porous structure.

In the cleaning method of a porous surface according to the present invention, the hydrophilic process of the porous surface may be a process for immersing the substrate in ozone pure water in which ozone is dissolved in pure water.

In the cleaning method of a porous surface according to the present invention, the hydrophilic process of the porous surface may be a process for immersing the substrate in a hydrogen peroxide solution diluted with pure water.

In the cleaning method of a porous surface according to the present invention, the aforementioned liquid may be ozone pure water in which ozone is dissolved in pure water.

In the cleaning method of a porous surface according to the present invention, the aforementioned liquid may be a hydrogen peroxide solution diluted with pure water.

In the cleaning method of a porous surface according to the present invention, the hydrophilic process of the porous surface may be a process for forming an oxide film over the substrate surface and over the internal walls of pores in the porous structure, and the oxide film at least over the substrate surface may be removed after cleaning the porous surface of the substrate.

The present invention can clean the substrate by effectively removing the dust particles on the surface of the substrate having the porous structure in the surface, for which there was no effective cleaning method heretofore, by the use of a high-frequency ultrasonic wave without collapse of the porous structure.

In addition, since the cleaning effect is achieved only with the use of pure water, the present method is free from the problem of chemicals remaining inside the porous structure, and introduction of the present cleaning method to conventional processing steps is easy.

Since the high-frequency cleaning methods of the present invention can be easily introduced, for example, to the pure water rinse step after the conventional anodization process or after the oxidation process conducted thereafter, the introduction thereof is easy in terms of workability, cost effectiveness, and stability.

The term "pure water" is defined as water prepared by removing any impurity as much as possible. In the semiconductor process, pure waters having various purity levels as shown in Tables 1 and 2 are used according to an integration degree of a semiconductor device to be prepared:

TABLE 1

| Contamination in ultrapure-water | |
|---|---|
| Pure water standards | Contamination-type |
| Particle bacteria | Particle contamination |
| Total silica | |
| Metallic ion (positive ion & negative ion) | Metallic contamination |
| TOC (Total organic carbon) | Organic contamination |
| DOC (Dissolved oxygen concentration) | Native oxide growth |

TABLE 2

| | | Water quality required for ultrapure water | | | | |
|---|---|---|---|---|---|---|
| | | 1 MB | 4 MB | 16 MB | 64 MB | 256 MB |
| Resistivity | [MΩ · cm] | 17.5–18 | >18.0 | >18.1 | >18.2 | >18.2 |
| Particle | >0.1 μm | 10–20 | <5 | | | |
| | >0.05 μm | | <10 | <5 | <1 | |
| | >0.03 μm | | | | <10 | <5 |
| Bacteria | | 10–50 | <10 | <1 | <0.1 | <0.1 |
| Total silica | [ppb] | 5 | <1 | <0.5 | <0.1 | <0.1 |
| TOC | [ppb] | 30–50 | 10–20 | <2 | <1 | <0.2 |
| DOC | [ppb] | 30–50 | 20–50 | <10 | <5 | <1 |
| Metallic ion | [ppt] | 100–500 | <100 | <50 | <10 | <5 |

BRIEF DESCRIPTION OF THE DRAWINGS

FIG. 4 is a graph to show the relationship between concentration of residual oxygen and number of bubbles generated in the ultrasonic cleaning in pure water;

DETAILED DESCRIPTION OF THE PREFERRED EMBODIMENTS

Embodiments of the present invention will be described, and it is noted that combinations thereof within the scope of the present invention.

(Embodiment 1)

A cleaning method of a porous surface according to the present invention is a method for superimposing an ultrasonic wave in the high-frequency band, the frequency of which is in the range of from 200 kHz to 8.4 MHz, preferably in the range of from 600 kHz to 2 MHz, more preferably in the range of from 800 kHz to 1.6 MHz, on pure water and exposing a surface of a porous substrate thereto.

Figure 2:
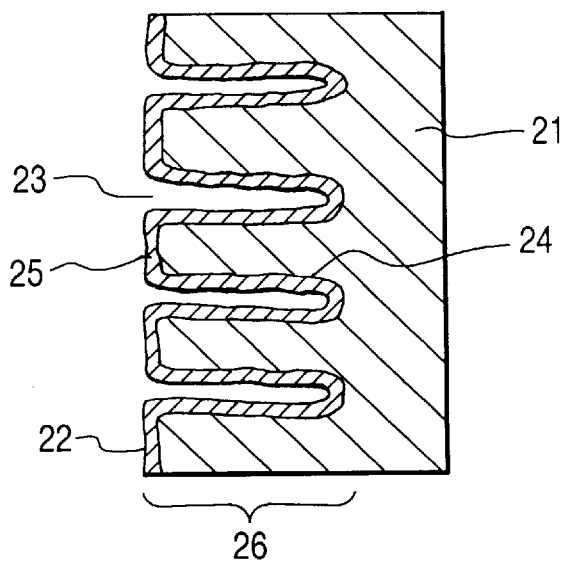
FIG. 2 is a cross-sectional view to show an example of the porous silicon substrate.

In the cleaning method of a porous surface according to the present invention, there is no specific limitation on the material for the substrate if the substrate is the one having the porous structure in the surface, as shown in FIG. 2. The cleaning method can be applied, for example, to semiconductor materials such as Si or GaAs, ceramic materials, etc. FIG. 2 illustrates the structure in which a semiconductor thin film of amorphous Si, polycrystal Si, GaAs, or the like or a metalized layer is deposited by chemical vapor deposition or the like over the internal wall surfaces of pores in the Si porous substrate. In FIG. 2, reference numeral 21 designates the substrate, 22 the surface of the substrate, 23 the pores, 24 the internal walls of the pores, and 25 the deposit film. Further, numeral 26 denotes the porous structure.

Described below is cleaning of a porous silicon substrate as an example of the cleaning method of porous surface according to the present invention.

Sizes of dust particles that can be removed by ultrasonic are determined depending upon the frequency. For example, it is said that the sizes of dust particles that can be removed by high-frequency waves of 800 kHz or more are approximately 0.1 $\mu$m. The molecular acceleration given to the dust particles at this time becomes approximately a quarter million times greater than the acceleration of gravity on the surface of Earth, and the dust particles are removed by this kinetic energy. The wavelengths are as short as 0.8 mm in pure water, the waves are irregularly reflected at the surface of liquid, and some of the waves travel into the air, so that a standing wave, as seen with the ultrasonic in the low-frequency band, is rarely generated in the pure water. Thus, cleaning unevenness is little.

Since the ultrasonic waves have short wavelengths and high directivity, damage on the fine and fragile surface of porous silicon can be decreased by making the ultrasonic wave act in parallel to the substrate surface. In addition, the high-frequency waves are excellent in the removal of dust particles because of their small amplitudes and large number of scrubs on the substrate surface. Moreover, generation of ions in pure water decreases its specific resistance, so that re-adhesion of dust particles due to self-charging of the substrate is minimum.

However, there has been no example of the application of ultrasonic cleaning to cleaning of a porous silicon surface, and it is thus needless to mention that no example of removing dust particles from the porous silicon surface with pure water exists. The present inventor found that, for cleaning the porous substrate with pure water to which the high-frequency wave is applied, unlike the bulk substrate, a certain effective range exists for the high-frequency waves based on the properties of the porous substrate. This will be described with FIG. 1. In the ultrasonic cleaning of substrate, the frequency used is determined depending upon the size of dust particle. For example, from FIG. 1, it is effective to apply ultrasonic waves of frequencies of about 80 to 90 kHz in order to remove the dust particles of the particle size of 1 $\mu$m from the substrate and to apply ultrasonic waves of frequencies of about 800 to 900 kHz in order to remove the dust particles of the particle size of 0.1 $\mu$m from the substrate.

Figure 1:
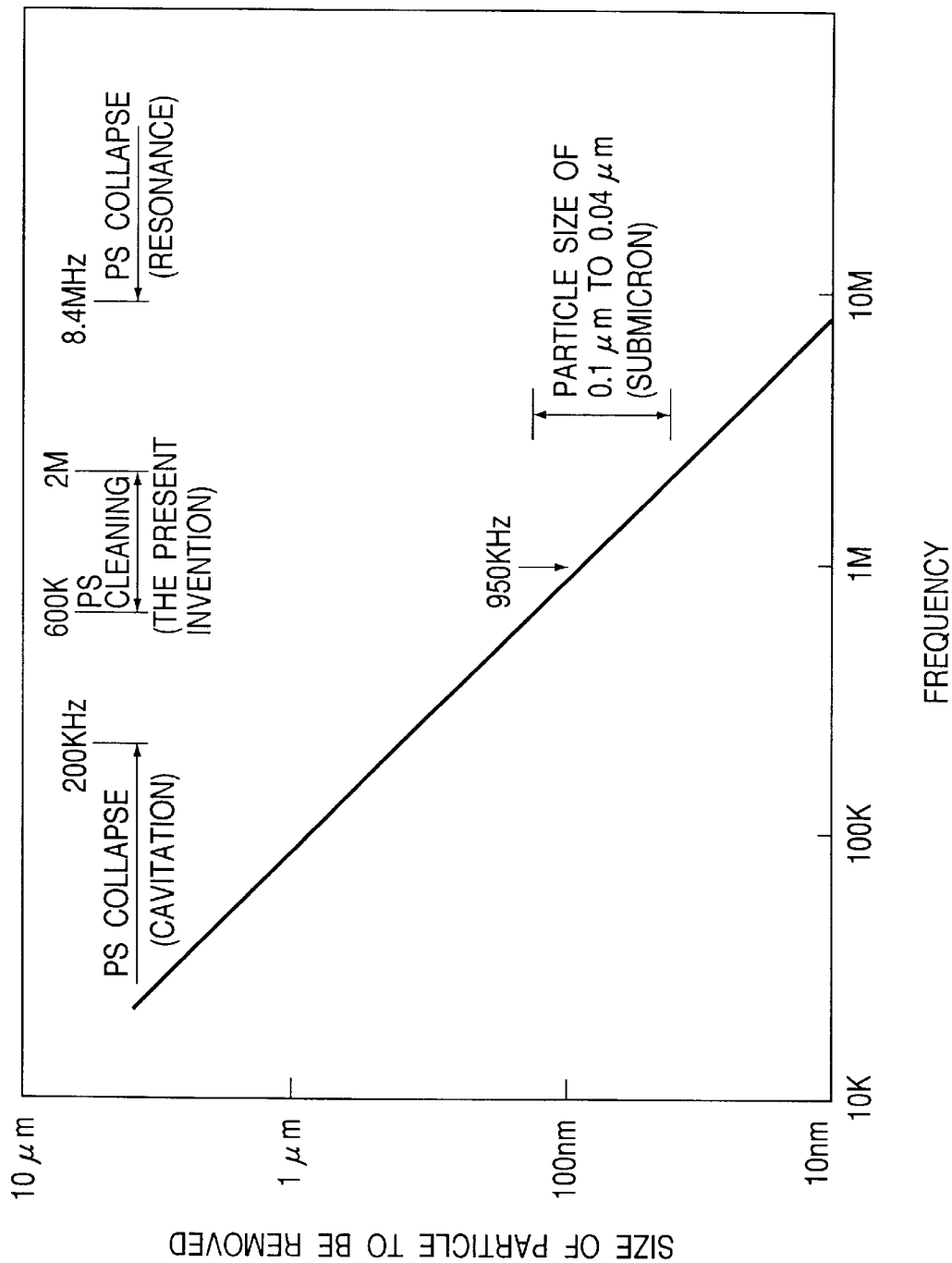
FIG. 1 is a graph to show the relationship between frequencies of ultrasonic cleaning and sizes of particles to be removed and to show the frequency range of the present invention.

However, the experiments by the present inventor showed that in the porous Si substrate, collapse of the porous structure was observed under 200 kHz, and collapse of porous structure was also observed similarly over 8.4 MHz, as shown in FIG. 1. This is because use of ultrasonic wave for cleaning porous substrates raises problems, which are not experienced in the case of bulk substrates.

As already described, the porous structure is the fine structure of several hundred angstroms or less in the case of porous silicon of $p^+$-type and $p^-$-type or $n^-$-type, and the experiments by the present inventor showed that the fragile porous surface collapsed because of cavitation when the ultrasonic waves of frequencies under 200 kHz were used.

According to the experiments by the present inventor, use of ultrasonic waves of the frequencies over 8.4 MHz caused the fine porous structure itself to resonate, similarly resulting in collapse of the porous structure. The resonance frequency depends upon the porous structure. In the case of the porous structure having relatively large hole sizes and thicknesses of silicon walls ranging from several hundred nm to several ten $\mu$m like $n^+$-type porous silicon, the lower limit frequency of ultrasonic wave that can be used becomes higher than that.

Accordingly, the ultrasonic cleaning of a porous silicon surface is conducted with a high-frequency wave in the frequency band of from 200 kHz to 8.4 MHz, preferably in the range of 600 kHz to 2 MHz. More preferably, the ultrasonic cleaning is conducted with a high-frequency ultrasonic wave in the frequency band classified megasonic, in the range of from 800 kHz to 1.6 MHz, thereby avoiding the risk of collapse of the porous structure.

The bulletin of Japanese Laid-Open Patent Application No. 51-2264 discloses, as to high-frequency cleaning, that cleaning of semiconductor wafers takes place with the high-frequency ultrasonic wave in the range of 200 kHz to 5 MHz, but it discloses application of the high-frequency ultrasonic wave to hydrogen peroxide and ammonia (chemicals) and nothing about cleaning of a porous substrate with pure water. Also, Japanese Laid-Open Patent Application No. 6-275866 discloses immersion of a porous semiconductor in pure water with the ultrasonic wave being applied thereto, but the immersion in pure water is to improve light emitting characteristics and not for clean. It discloses nothing about the frequency of ultrasonic wave at all. Further, Research Report, the Institute of Electronics, Information and Communication Engineers, SDM95-86, ICD95-95, pp. 105–112, July 1995, described above as prior art, discloses cleaning of bulk substrates with chemicals to which ultrasonic wave is applied and rinsing thereof with pure water to which the high-frequency wave is applied, but discloses nothing about cleaning for removing dust particles on the porous substrate with pure water.

On the other hand, another problem specific to the ultrasonic cleaning of porous silicon is generation of bubbles during cleaning.

Gas taken into the inside of porous silicon during the anodization process or during drying thereafter is discharged out of the pores as being replaced with pure water during the ultrasonic cleaning, and in the hydrophobic case, it adheres in the form of bubbles to the substrate surface. The bubbles impede propagation of ultrasonic waves and degrade the removing effect of dust particles, and they promote adsorption of dust particles, thus causing re-adhesion of dust particles to the substrate.

Bubbles are also generated by factors other than the substrate structure. In general, bubbles are generated because of the cavitation in the case of the low-frequency ultrasonic wave, while they are generated because of the dissolved gas in pure water in the case of the high-frequency ultrasonic wave. Small bubbles adhering to the porous silicon surface cannot be removed by high-frequency cleaning without use of shock wave, but they can be removed by intermittently lifting the substrate out of the pure water during the ultrasonic cleaning.

On the other hand, though not limited to ultrasonic cleaning, batch-type cleaning for setting plural substrates together on a carrier and immersing them in a cleaning bath has a problem that the cleaning carrier of polytetrafluoroethylene (e.g., Teflon), used for supporting the substrates during cleaning, is normally charged when simply immersed in pure water, whereby the substrate at the position of the carrier end is inductively charged to adsorb the dust particles.

It is also possible to employ carrierless batch cleaning at present, but in the case of the carrier being used, a dummy substrate, used only during cleaning, is placed at the carrier end, whereby the dust particles can be prevented from adhering to the substrates at the other carrier positions. In the case wherein the porous silicon layer is formed only on one surface, the dust particles can be prevented from adhering to the porous surface by reversely setting the porous silicon substrate at the carrier end and normally setting the other substrates. This is a countermeasure in the case of batch cleaning, but, in the case of single wafer spin cleaning for cleaning the substrate surface under rotation with a pure water shower on which the high-frequency ultrasonic wave is superimposed, this operation becomes unnecessary.

In cleaning with the pure water shower, a problem is adsorption of dust particle due to charging of the substrate caused by triboelectrification between a nozzle and flowing water, but this problem can be avoided by decreasing the specific resistance of pure water by superposition of a high frequency wave. When the shower is utilized, it is necessary to remove the dust particles only by high-frequency vibration and to conduct cleaning under such a water pressure condition as to avoid collapse of porous silicon.

As described above, the present embodiment can remove the dust particles on the surface with only the pure water and high-frequency ultrasonic wave without collapse of porous silicon.

In the case wherein dust particles newly adhering to the surface of a porous silicon substrate with the porous internal walls thermally oxidized re-adhere to a hydrophobic surface after the oxide film of the outermost surface layer is etched in a diluted hydrofluoric acid reservoir, the dust particles can also be removed by high-frequency ultrasonic cleaning in pure water.

(Embodiment 2)

Figure 28:
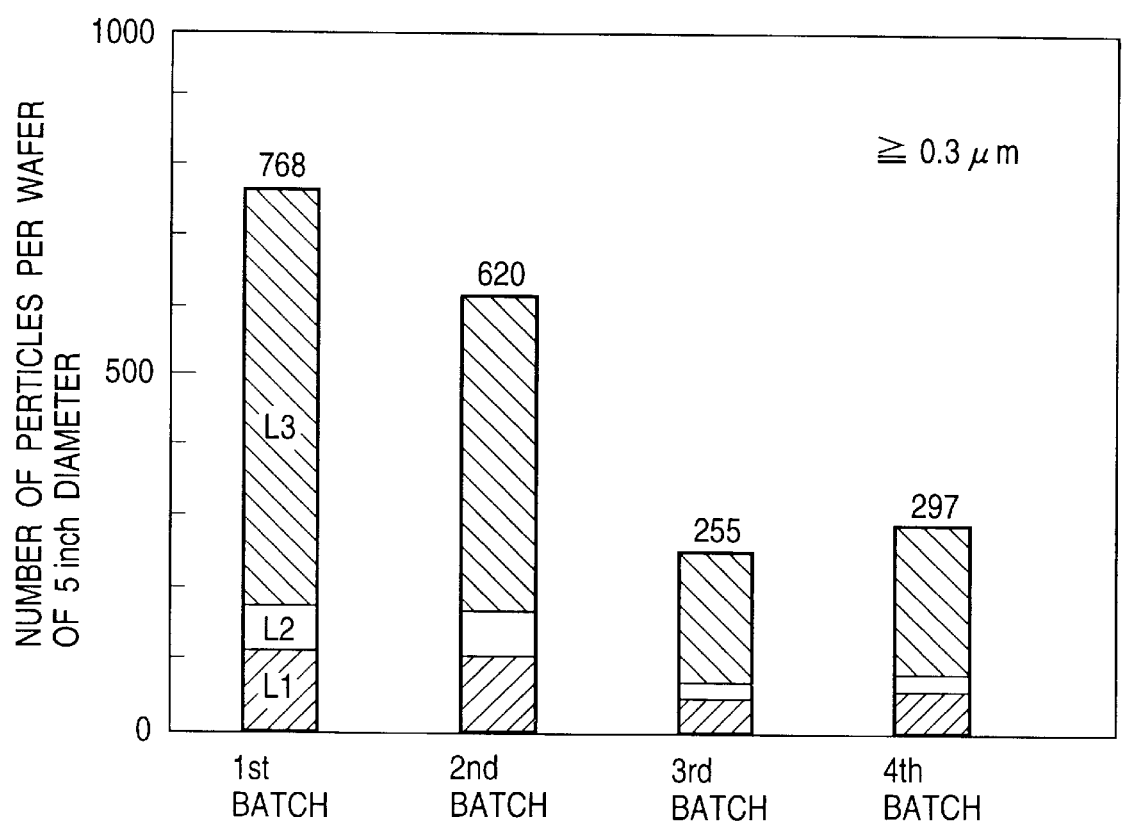
FIG. 28 is a graph to show the numbers of dust particles on the porous silicon surface in the order of batches of anodization where cleaning is ended only with the conventional pure water rinse after anodization.

As described previously, it was found by the research of the present inventors that even several hundred dust particles not less than 0.3 $\mu$m, obtained from the laser reflection intensity distribution, adhered to the surface of a porous silicon substrate having the porous structure which was made by anodization and rinsed with pure water, in the 5-inch-diameter wafer (FIG. 28). The conceivable causes of adhesion of dust particles include dust mixed in the anodization apparatus and in the electrolyte solution and the dust generated by the workers during the process, and it is also conceivable that the porous silicon surface becomes hydrophobic because of anodization in the high-concentration hydrofluoric electrolyte solution, so that the silicon substrate becomes easy to charge electrostatically so as to adsorb dust particles. Therefore, prevention of adhesion of dust particle is not easy.

Since the porous structure is fine and dense and has long pores, use of chemicals in chemical wet cleaning as in the conventional RCA cleaning will result in deep intrusion of the chemicals into the pores, making it difficult to eliminate the chemicals completely even by pure water rinsing for a long time, thus negatively affecting the post-processes including epitaxial growth.

This problem results from the structure of porous silicon, and the experience of the present inventors is not peculiar. It is also believed that the reason why positive cleaning of a porous silicon surface has not been conducted heretofore is based on the same problem.

Embodiment 1 was the surface cleaning method of the fine and fragile porous structure, for which no preferred cleaning method had existed before, and was the method for cleaning the surface of a porous structure with the pure water on which the high-frequency ultrasonic wave, the frequency of which is in the range of from 200 kHz to 8.4 MHz, preferably in the range of from 600 kHz to 2.0 MHz, more preferably in the range of from 800 kHz to 1.6 MHz, is superimposed.

When ultrasonic cleaning is carried out with pure water, bubbles are generated in the pure water in the high-frequency case, especially, and those bubbles adhere to the porous silicon surface having a hydrophobic surface after removal of a surface oxide film.

The bubbles adhering to the surface are not easy to remove, especially when cleaning is made with the substrate to be cleaned being set in a pure water bath on which the ultrasonic wave is superimposed. Specifically, the small bubbles adhering to the substrate are not removed even by flowing water during cleaning, and the bubbles, while small, cannot move on the substrate surface by their own buoyancy and are thereby fixed thereon. The bubbles impede propagation of ultrasonic waves so as to degrade the cleaning effect and also draw fine dust particles in the pure water to the gas-liquid interface, in turn contaminating the substrate surface to be cleaned.

Thus, Embodiment 1 is a method for avoiding such problem of contamination of the cleaned substrate due to generation of bubbles realizes the cleaning effect of the high-frequency ultrasonic wave while avoiding contamination due to dust particles, by regularly lifting the cleaned substrate out of the pure water bath during cleaning to thereby remove the bubbles.

Figure 3A:
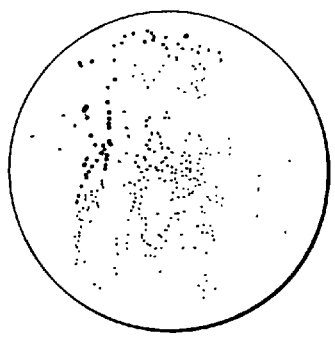
FIGS. 3A and 3B are drawings to show adhesion states of dust particles on a wafer after cleaning in the case of only immersion (FIG. 3A) and in the case of lifting every five minutes (FIG. 3B)
Figure 3B:
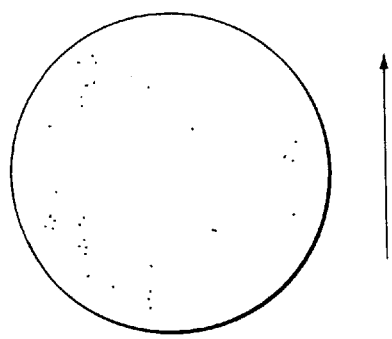

FIGS. 3A and 3B show states of bubbles remaining on the wafer. FIG. 3A illustrates positions and the number of dust particles not less than 0.2 μm on a 5-inch-diameter bulk wafer surface where only immersion was conducted and removal of bubbles was not carried out in the ultrasonic cleaning in pure water. FIG. 3B similarly illustrates positions and the number of dust particles where removal of bubbles was carried out by lifting the wafer every five minutes. The number of dust particles is 450 in FIG. 3A, while it is 35 in FIG. 3B. As apparent from comparison between FIG. 3A and FIG. 3B, the dust particles aggregate densely along the bubble rise direction (indicated by the arrow in each drawing) when the removal of bubbles is not carried out, whereas the removal of bubbles relieves this tendency.

When porous silicon having the hydrophobic surface is cleaned by this cleaning method for 20 minutes by superimposing the ultrasonic wave of 950 kHz on an ordinary-temperature over-flow pure water bath and lifting the substrate every five minutes out of the pure water bath for the removal of bubbles, approximately 30% to 40% of dust particles, which were unable to be removed before, can be removed from the surface of a porous substrate. With further repetition of the same cleaning for 20 minutes more, 60% to 80% of the dust particles before cleaning can be removed.

Such fixing of bubbles does not occur on a hydrophilic porous silicon surface having an oxide film on the surface, and the bubbles quickly rise to be eliminated, so that contamination of the substrate due to the dust particles can be avoided. Thus, almost 90% of dust particles were able to be removed by the high-frequency ultrasonic cleaning without regular lifting of the hydrophilic substrate.

In Embodiment 1, the dust particles were removed by the cleaning method with the pure water on which an ultrasonic wave in the high-frequency region is superimposed and the substrate is regularly lifted out of the pure water bath during cleaning.

There are, however, some cases wherein further removal of dust particles is desired depending upon purposes of use. If, in the above cleaning method, the cleaning period of time were prolonged in the ultrasonic pure water in order to further remove the dust particles, a native oxide film could be formed because of the pure water, and work efficiency could be reduced. This cleaning effect is not improved by raising the temperature of the pure water.

The method for regularly lifting the substrate out of the pure water bath during cleaning would be extremely cumbersome, for example, if the cleaning relied on worker labor. Further, it is not easy to perfectly avoid generation of bubbles and adhesion thereof to the substrate during cleaning even by carrying out the bubble removing operation based on the regular lift. Thus, a further improvement is desired in terms of reproducibility and stability of cleaning.

Thus, Embodiment 2 was achieved as a result of further research and is a method for cleaning the substrate with pure water from which dissolved gas is deaerated, thereby preventing contamination of the substrate due to the dust particles in the pure water, caused by generation of bubbles and adhesion thereof to the substrate during ultrasonic cleaning.

In the cleaning of a semiconductor substrate, it is known that $O_2$ and $CO_2$ are deaerated for antioxidation on the semiconductor substrate. However, $N_2$, reducing gas, was not considered specifically to be a problem. On the contrary, the cleaning water was used with $N_2$ taken in up to the saturation concentration thereof (17.8 ppm at 25° C. and 6.7 ppm in warm pure water of 80° C.). The present inventor checked the number of bubbles generated with ultrasonic waves of frequencies of 47 kHz and 950 kHz and with changing concentration of residual oxygen for the pure water of 25° C. containing $N_2$, as shown in FIG. 4. The number of bubbles generated in the case of the frequency of 950 kHz was greater than that in the case of the frequency of 47 kHz. At 5 ppm, 100 or more bubbles were generated in either case, and these bubbles were found to be a cause of adhesion of dust particles. It was also found that it was not easy to avoid the generation of bubbles, even if the pure water was heated to 80° C.

Thus, the present inventor also checked the number of bubbles generated by the ultrasonic waves of the frequencies of 47 kHz and 950 kHz with changing concentration of residual oxygen similarly and with also deaerating $N_2$. The present inventor found that substantially no bubbles were generated around 6 ppm at 47 kHz or around 3 to 5 ppm at 950 kHz, so that deaeration (including $N_2$) was able to suppress the generation of bubbles independently of the frequencies of ultrasonic waves so as to remove the dust particles from the substrate, thus achieving the present invention.

Figure 5:
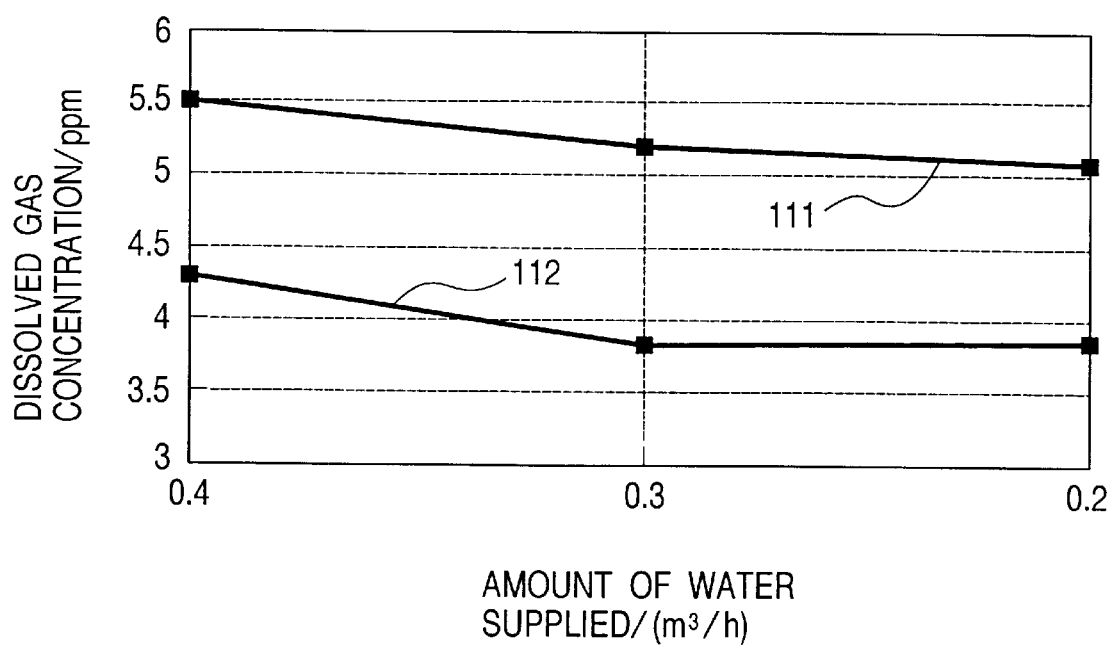
FIG. 5 is a graph to show concentrations of dissolved gas not generating bubbles in the megasonic irradiation area.

The present inventor measured in great detail concentrations of dissolved gas in pure water in a square-shaped over-flow bath in a water supply state, using a dissolved oxygen/dissolved nitrogen sensor available from Orbisphere Laboratories, Inc. From the results of the measurement, when water was supplied from the bottom portion of the over-flow bath under irradiation of megasonic wave of power 600 W and frequency 950 kHz and, though depending upon the rate of water supplied as shown in FIG. 5, when the rate of water supplied was in the range of 0.2 $m^3$/hr to 0.4 $m^3$/hr optimum for the over-flow operation, no bubbles were found to be generated in the entire area of the bath, if the concentration of dissolved nitrogen in the pure water as the supplied water was under the range of 5 ppm to 5.5 ppm and if the concentration of dissolved oxygen was under the range of 3.83 ppm to 4.3 ppm. In FIG. 5, curve 111 represents the concentration of dissolved nitrogen and curve 112 the concentration of dissolved oxygen.

In the normal semiconductor processes, pure water with nitrogen gas dissolved after primary deaeration is used at a use point.

The present inventors also used the pure water containing the dissolved oxygen in the concentration of 7.38 ppb and the dissolved nitrogen in the concentration of 14.57 ppm close to the saturation concentrations thereof before, but bubbles were generated by megasonic irradiation if only the dissolved oxygen was deaerated and if the dissolved nitrogen existed at 5 ppm or more.

From this, it is necessary to control concentrations of gases dissolved in high concentrations among the dissolved gases in the pure water in order to suppress the generation of bubbles when the megasonic wave is applied to the pure water, and it is thus necessary at least to control the concentrations of nitrogen, oxygen, and $CO_2$, which are the main component gases of air. (Dalton's law of partial pressure)

The reason why the main component gases of air are noted particularly is that the bath used for cleaning is normally of such structure that the surface of liquid is open to the atmosphere and that even with the over-flow operation, the gases composing the atmosphere (air) are re-dissolved into the liquid from the liquid surface and amounts thereof are not negligible.

The re-dissolution of air in contact with the liquid surface is outstanding in the case of a water reservoir. Even if deaerated water is supplied from the reservoir bottom to be stored, concentrations of dissolved gases increase toward the liquid surface with respect to those at the reservoir bottom, thus making distributions of concentrations of dissolved gases in the reservoir. With a lapse of time, the distributions in the reservoir are made even to high concentrations, which makes control of concentrations of dissolved gases difficult. (Henry's law)

On the other hand, in the case of the over-flow bath, the pure water containing controlled concentrations of dissolved gases is always supplied by supplying deaerated water from the bath bottom portion and flows over to be drained out of the bath. This is considered to be a reason why it is possible to control the concentration of dissolved gas in the bath.

In practice, however, there appears such a phenomenon, depending upon the rate of water supplied, that the deaerated water reaching the liquid surface comes to contact the atmosphere so as to re-dissolve the gases and part thereof is not drained thereby again circulating in the bath and increasing the concentrations of dissolved gases in the bath.

In order to solve this problem, important points are optimum design of structure of a bath and optimum setting of the rate of water supplied.

Figure 6A:
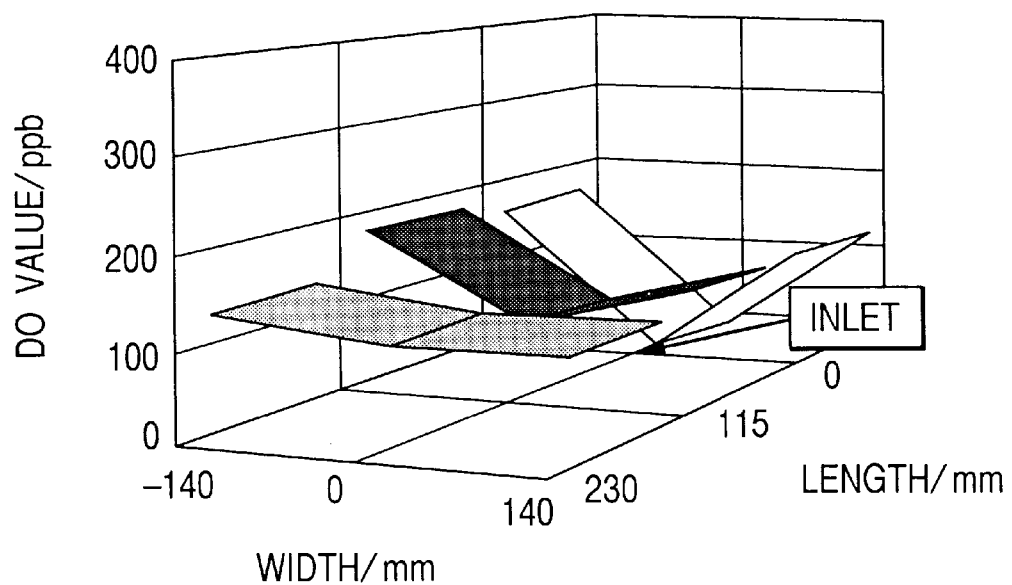
FIGS. 6A and 6B are graphs to show concentration distributions of dissolved oxygen in bath.
Figure 6B:
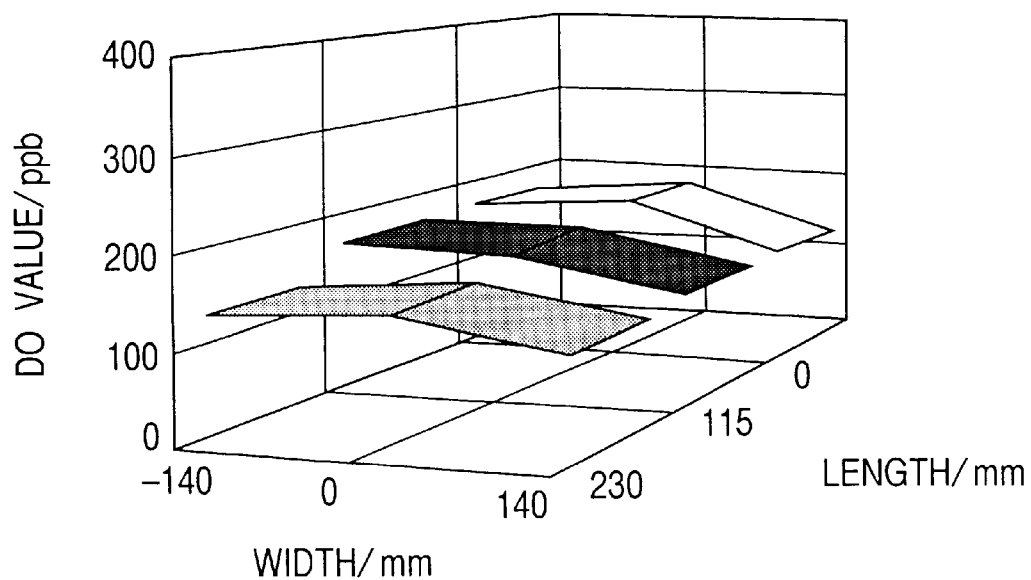
Figure 7A:
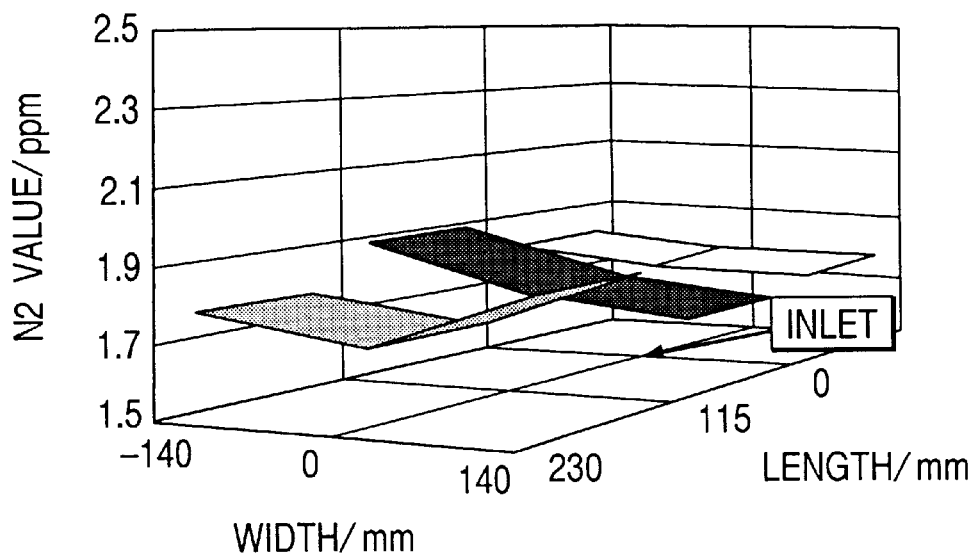
FIGS. 7A and 7B are graphs to show concentration distributions of dissolved nitrogen in bath.
Figure 7B:
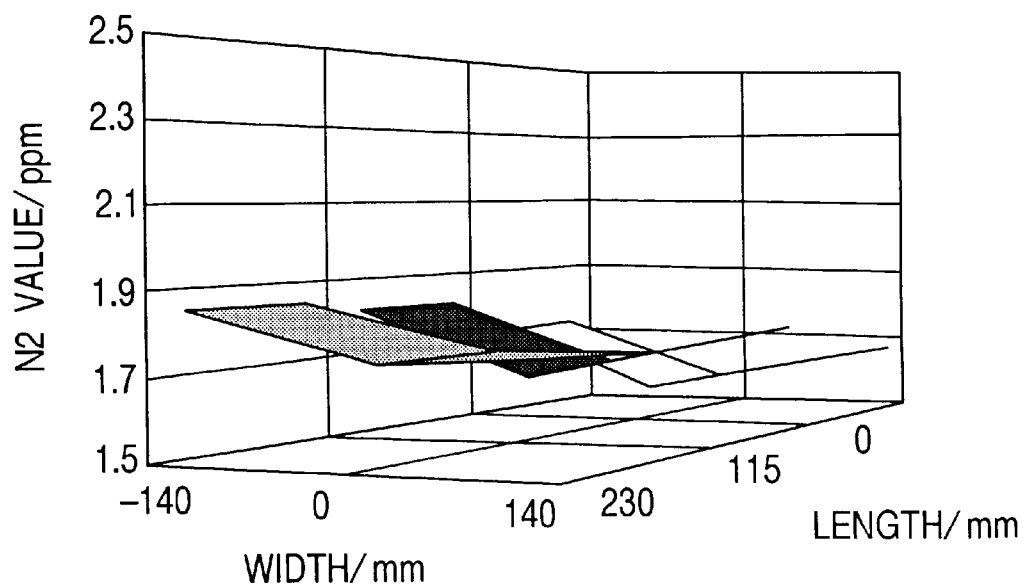

As an example, distributions of dissolved oxygen concentration (D0 value) and dissolved nitrogen concentration (N2 value) at the depth 25 cm (at the bath bottom) and at the depth 12.5 cm (at the middle of bath) in the square-shaped over-flow bath of the size of the width 28 cm, the length 23 cm, and the depth 25 cm employed by the present inventor are illustrated in FIG. 6A, FIG. 6B, FIG. 7A, and FIG. 7B. Here, FIG. 6A shows the concentration distribution of dissolved oxygen in the bath at the depth of 25 cm (at the bottom of bath), and FIG. 6B shows the concentration distribution of dissolved oxygen in the bath at the depth of 12.5 cm (at the middle of the bath). FIG. 7A shows the concentration distribution of dissolved nitrogen in the bath at the depth of 12.5 cm, and FIG. 7B shows the concentration distribution of dissolved nitrogen in the bath at the depth of 25 cm.

While the pure water of the oxygen concentration 1.88 ppb and the nitrogen concentration 1.542 ppm after secondary deaeration at the use point was being supplied at the water supply rate 0.3 $m^3$/hr from the bath bottom portion (at the depth of 25 cm) to flow over, the concentration of dissolved oxygen and the concentration of dissolved nitrogen were measured at each position in the bath.

The arrow in the drawing indicates a direction of water supply in the bath bottom portion.

Regardless of the gas species, the concentration of dissolved gas is lowest at the water supply port and the concentration increases with increasing distance from the water supply port along the flow of the pure water in the bath bottom portion. At the depth 12.5 cm, the concentrations were higher than in the bath bottom portion, but the concentration distributions were almost uniform, showing the oxygen concentration of about 150 ppb and the nitrogen concentration of about 1.8 ppm.

Here, turbulent flow occurs in the flow of water, depending upon the position and direction of the water supply port and the water supply rate, which increases the concentrations in the bath. Thus, for example, when the concentrations in the bath are controlled by the concentrations of dissolved gases in the secondarily deaerated water, optimum design to keep the concentrations in the bath low as described above is necessary.

Further, the concentrations of dissolved gases in the deaerated water in the over-flow bath under megasonic irradiation slightly increase with time of irradiation.

Figure 8A:
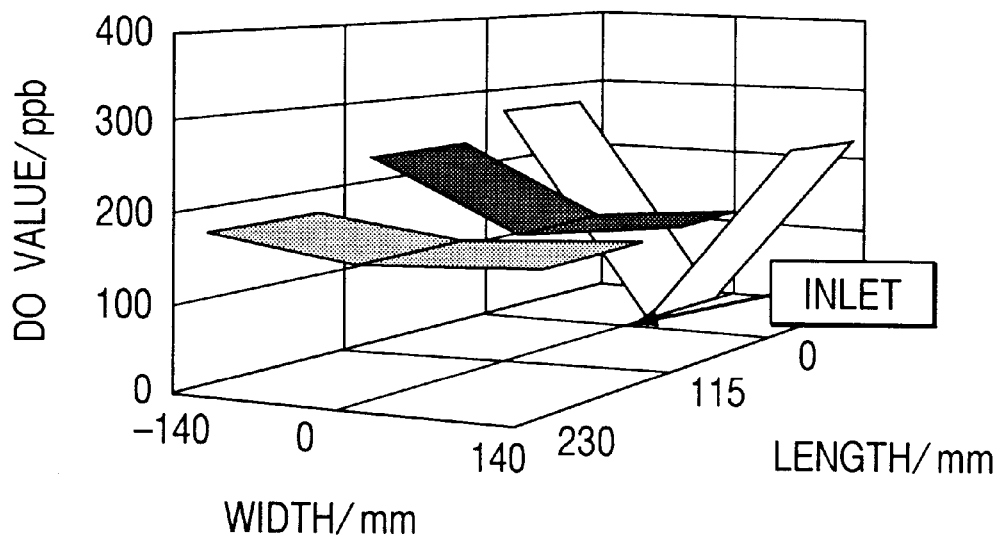
FIGS. 8A and 8B are graphs to show concentration distributions of dissolved oxygen upon megasonic irradiation.
Figure 8B:
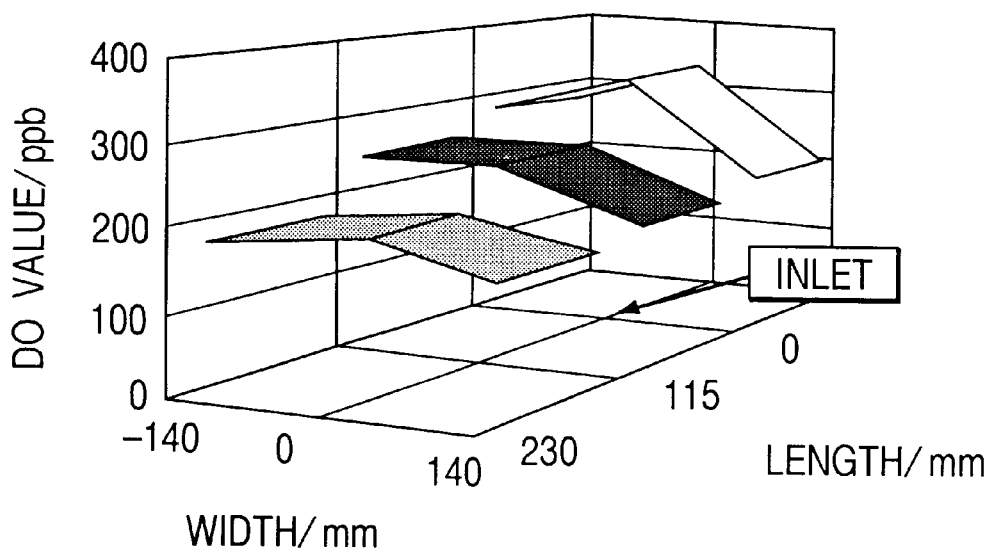
Figure 9A:
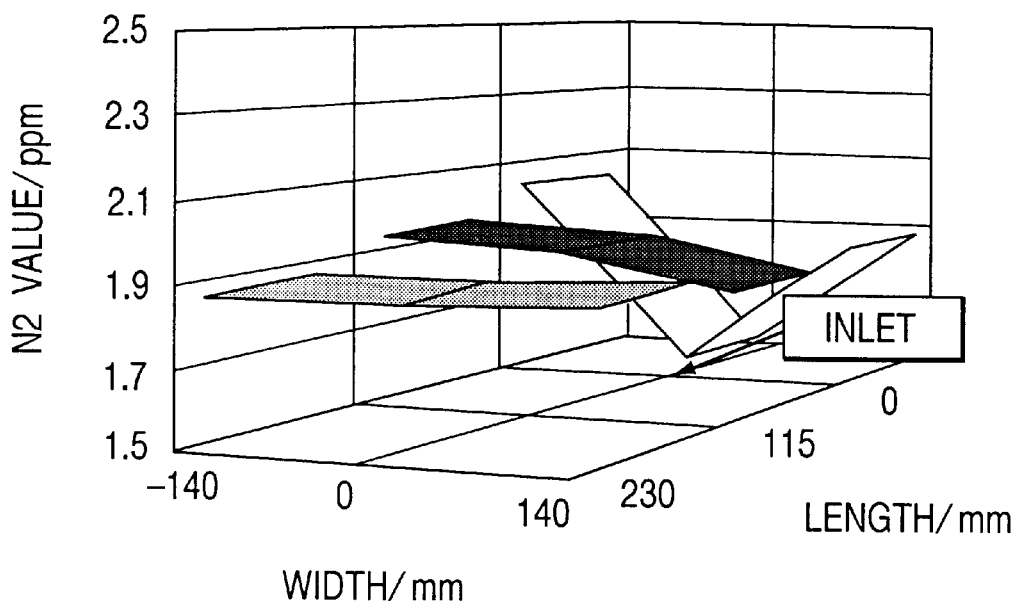
FIGS. 9A and 9B are graphs to show concentration distributions of dissolved nitrogen upon megasonic irradiation.
Figure 9B:
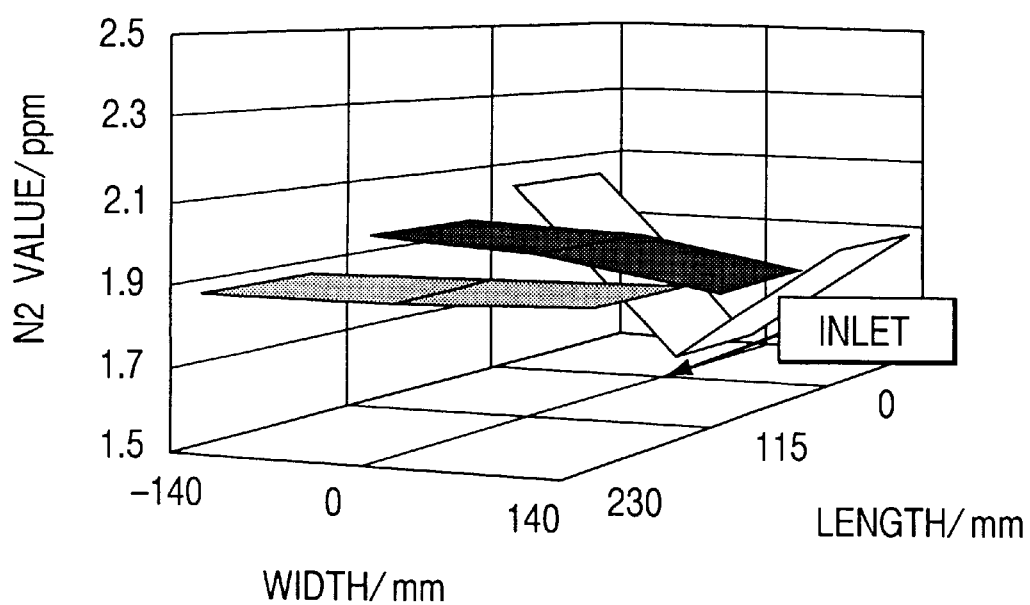

Concentration distributions of dissolved oxygen in the over-flow bath under megasonic irradiation of power 600 W and for 10 minutes from the bath bottom portion are shown in FIG. 8A and FIG. 8B, and concentration distributions of dissolved nitrogen are shown in FIG. 9A and FIG. 9B. Here, FIG. 8A shows the concentration distribution of dissolved oxygen at the depth of 25 cm (at the bath bottom) under megasonic irradiation, and FIG. 8B shows the concentration distribution of dissolved oxygen at the depth of 12.5 cm (at the middle of bath) under megasonic irradiation. FIG. 9A shows the concentration distribution of dissolved nitrogen at the depth of 25 cm under megasonic irradiation, and FIG. 9B shows the concentration distribution of dissolved nitrogen at the depth of 12.5 cm under megasonic irradiation. Although changes are small, it is necessary to set the concentrations of dissolved gases in the deaerated water supplied, also taking such concentration changes under the conditions of practical use into consideration, in order to accurately control the concentrations of dissolved gases in the bath.

Namely, the cleaning method of a porous surface according to the present invention is arranged in such a way that cleaning for removing the dust particles adhering to the surface of substrate takes place with the pure water from which the dissolved gas is deaerated until the concentration of dissolved gas becomes 5 ppm or less and on which the ultrasonic wave is superimposed. "The concentration of dissolved gas is 5 ppm or less" means that the concentration of any dissolved gas, regardless of the kind of dissolved gas, is 5 ppm or less, but in general, it is sufficient that the concentrations of dissolved gases including oxygen, nitrogen and $CO_2$ as the main components of air, are 5 ppm or less.

Figure 10:
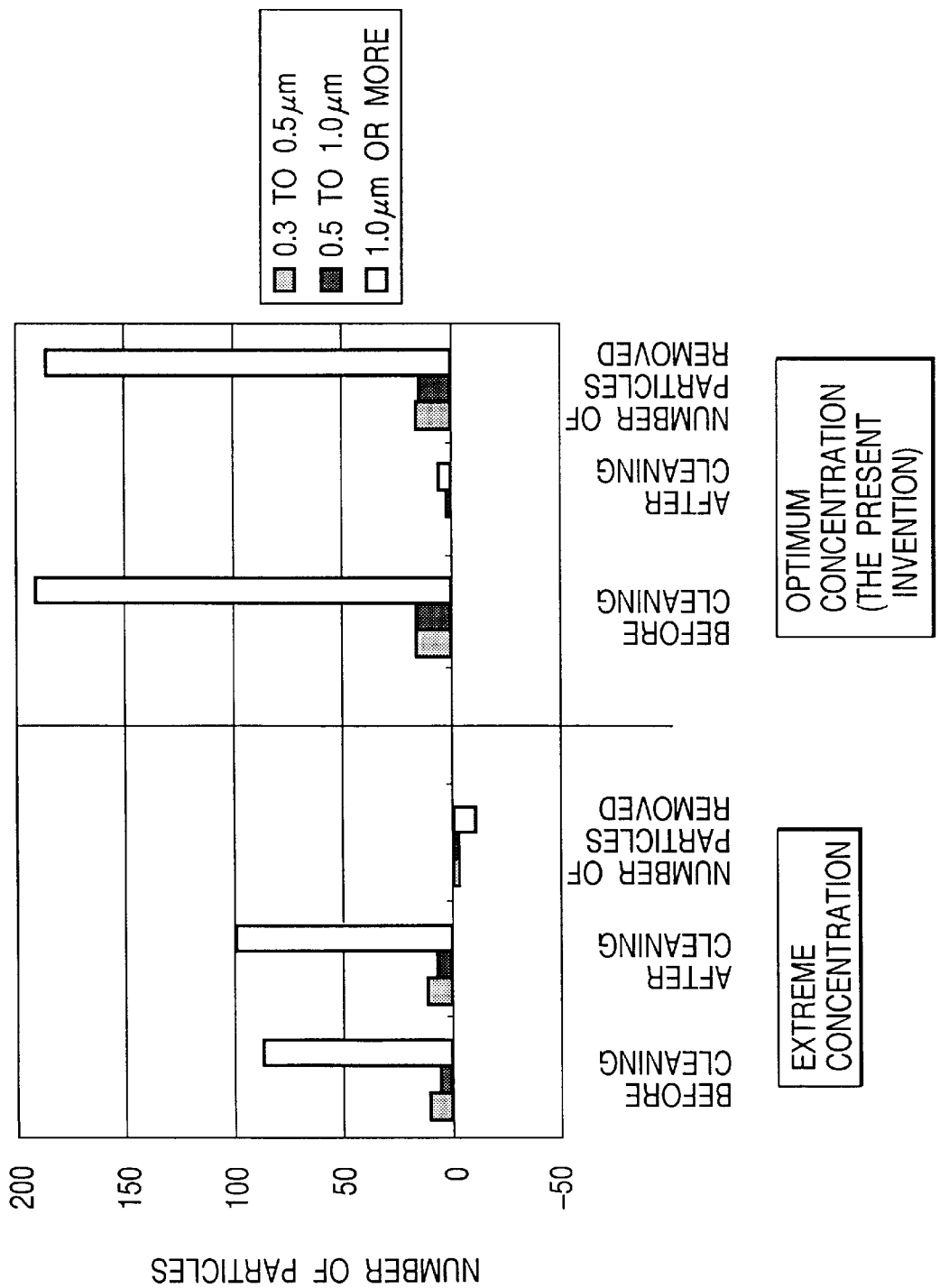
FIG. 10 is a graph to show concentration dependence of dissolved gas in pure water in the megasonic cleaning.

However, megasonic cleaning experiments by the present inventor, as to concentration dependence of dissolved gas in the pure water in the megasonic cleaning, showed clearly, as shown in FIG. 10, that the cleaning effect of the megasonic irradiation was excellent with use of deaerated water in the controlled concentrations of dissolved gases below the boundaries not generating bubbles (the concentration of dissolved nitrogen not more than 5 ppm and the concentration of dissolved oxygen not more than 3.8 ppm). No cleaning effect by megasonic irradiation was achieved at all with use of deaerated water by secondary deaeration to the limit to decrease the dissolved gases (up to the concentration of dissolved oxygen of 150 ppb and the concentration of dissolved nitrogen of 1.8 ppm as concentrations in the bath), though no bubbles were generated.

The reason for this is not yet apparent, but the principle of megasonic cleaning is not only based "sound wave scrub cleaning" as mentioned heretofore, but also based on the synergistic effect with "liquid resonance cleaning" by cavitation, as in low-frequency ultrasonic cleaning. Generation of bubbles by megasonic irradiation under existence of the high concentrations of dissolved gases is also evidence of the liquid resonance phenomenon.

It is, however, known that in megasonic cleaning, the sound pressure generated by cavitation impact is very low, and the cavitation phenomenon will be weak, even if liquid resonance is present.

It is said that the radius of cavitation decreases with increasing frequency in ultrasonic vibration. Supposing that the sound pressure is generated by cavitation, more dense generation of high-frequency resonance than of low frequency does not always contradict with the weak cavitation impact.

The small radius of cavitation and the high density thereof will result in excellent performance for removing particles of smaller particle sizes.

The cavitation phenomenon splits water molecules by ultrasonic vibration, irrespective of the frequency, whereby a kind of small space in a vacuum state is made in the pure water. It is thus conceivable that this space expands and quickly contracts, thereby generating the sound pressure.

It can be considered that the generation of bubbles occurs in such a way that the gas dissolved in water is deaerated into this space in the vacuum state and that when the space contracting speed is greater than the speed of re-dissolution of the gas in the space into the pure water and when the density of gas is high, the gas, having nowhere to go, remains in the form of bubbles.

The bubbles adhering to a hydrophobic substrate, which are not removed by over flow, disappear several minutes (two to three minutes) after supply of the pure water deaerated to the limit after stopping the ultrasonic irradiation.

From this, the gas deaerated into the fine vacuum space by cavitation is believed to re-dissolve in the pure water.

Control of the generation of bubbles under ultrasonic irradiation by controlling the concentration of dissolved gas is nothing but decreasing the amount of gas remaining as bubbles by lowering the density of gas deaerated and discharged into the fine vacuum space.

It is, however, not clear why no megasonic cleaning effect appears in use of the pure water deaerated to the limit, but adhesion of particles increases on the contrary.

It is assumed that there is contribution of dissolved gas to the cavitation phenomenon, i.e., that the fine space is maintained by repetitive processes of vacuum, release (deaeration) of dissolved gas into the space, and re-dissolution of gas into the pure water upon contraction, or that it results from the electrochemical action due to generation of ion species from the dissolved gas in the pure water and the change of potential of the substrate due to megasonic irradiation, as mentioned heretofore.

The above cleaning method according to the present invention was developed as a cleaning method of a porous surface but the fact that bubbles cause adhesion of dust particles is not specific to porous surfaces. Thus, the invention can also be applied to cleaning of silicon wafers, SOI substrates, and so on, for example. The present invention is suitably applicable to cleaning of substrates having a hydrophobic surface, but it can also be applied to cleaning of substrates having a hydrophilic surface, wherein adhesion of dust particles can be prevented more certainly if the generation of bubbles is suppressed sufficiently.

The cleaning method of a porous surface according to the present invention is a method of cleaning comprising irradiating the surface of a porous silicon substrate with the ultrasonic wave in the high-frequency band in the range of from 200 kHz to 8.4 MHz, preferably in the range of from 600 kHz to 2 MHz, more preferably in the range of from 800 kHz to 1.6 MHz, as superimposed on pure water, and using the pure water from which the dissolved gas is deaerated, thereby preventing contamination of the substrate due to the dust particles in the pure water, caused by the generation of bubbles and adhesion thereof to the substrate during the ultrasonic cleaning and thereby realizing short-time and stable cleaning of the porous silicon surface having the hydrophobic surface.

The cleaning method of a porous surface according to the present invention includes no specific limitation on the surface of the substrate, if the substrate has a porous structure. For example, substrate materials may be semiconductor materials of Si, GaAs, or the like, the ceramic materials, and so on. Further, the cleaning method of a porous surface according to the present invention can also be used for removing the dust particles adhering to the substrate surface having the structure wherein a layer of semiconductor thin film of amorphous Si, polycrystal Si, GaAs, or the like or a layer of metal thin film is deposited by chemical vapor deposition or the like over the internal wall surfaces of pores of Si porous substrate, as shown in FIG. 2.

On the other hand, the following is the prior art related to the present invention. For achieving recent VLSI and ULSI of sub-micron order or deep-micron, it is necessary to suppress formation of native oxide film Morita et al. reported that dissolved oxygen in the pure water used for cleaning was a very important factor in the formation of native oxide film in pure water and that removal of dissolved oxygen to the limit was the minimum condition for suppressing the formation of native oxide film (Ultra Clean Technology, Vol. 1, No. 1, pp. 22–28, 1989).

Presently known methods for deaerating dissolved oxygen down to the dissolved oxygen concentration of 5 ppb or less in the water, close to the limit concentration region, include film deaeration as a physical deaeration method and a method of combination of a catalyst with a reducing method as a chemical deaeration method. Specifically, the film deaeration method is popularly used in recent years, because it contaminates the pure water minimally and because it can remove dissolved gases other than oxygen.

However, these technologies are not those associated with removal of dust particles from the substrate, and it is thus needless to mention that they suggest nothing about the cleaning of porous substrates.

The cleaning method of a porous surface according to the present invention will be described further. In ultrasonic cleaning bubbles are generated during cleaning. Sources to generate bubbles are the gas captured in the inside after drying of porous silicon and discharged as replaced by the pure water out of the holes during the ultrasonic cleaning and the dissolved gas such as oxygen and nitrogen dissolved in the pure water used for cleaning, which turn to bubbles because of the cavitation by ultrasonic application.

The bubbles adhering to the surface of a hydrophobic substrate impede propagation of ultrasonic waves so as to lower the removing effect of dust particle, and, in addition, they promote adsorption of dust particles to the substrate, thereby causing the contamination of the surface due to the dust particles and degradation of the cleaning effect.

As described previously, the bubbles adhering to the porous silicon surface can be removed by intermittently lifting the substrate out of the pure water during ultrasonic cleaning. However, if one of the causes of the generation of bubbles is the dissolved gas in the pure water used for cleaning, there will be naturally a limit of the cleaning effect even with such a technique.

As described previously, almost 90% of dust particles are removed by the high-frequency ultrasonic cleaning with pure water of the surface of a porous silicon substrate made hydrophilic by oxidation, and thus, the degree of impedance against cleaning due to deaeration of bubbles captured in the inside of a porous structure can be considered to be minute as compared with the problem caused by generation of bubbles from the pure water.

In the case of the porous structure having the hydrophobic surface, an amount of bubbles deaerated from the inside of the porous structure and fixed to the surface is considered to be far smaller than an amount of bubbles generated from the pure water.

In addition, since the bubbles themselves are not easy to deaerate in the case of the porous internal walls being hydrophobic, they are unlikely to be an element impeding cleaning. Accordingly, when one of the causes to generate bubbles is the dissolved gas in the pure water used for cleaning, it is most effective to use the pure water from which the dissolved gas in the pure water is deaerated, as in the present invention, for further enhancing the cleaning effect of the substrate.

This is effective not only in the case of cleaning with the substrate being immersed in the pure water bath and with the ultrasonic wave being superimposed in the water, but also in the case of cleaning with the ultrasonic wave being superimposed on a pure water shower and with the pure water shower being blown against the substrate.

When air of 25° C. and 1 atm is in contact with water, the gas dissolved in water is considered to be such that the concentration of dissolved oxygen in water is 8.26 ppm and the concentration of dissolved nitrogen is 13.9 ppm.

In general, the pure water used in the semiconductor fields is supplied under nitrogen purge of a pure water bath in a polishing system in order to maintain the purity of the pure water.

It is thus considered that nitrogen is dissolved almost in a saturated state in the pure water. For example, the saturation dissolution concentration of nitrogen gas (purity: 99.999%) under 25° C. and 1 atm into the pure water becomes 17.8 ppm. In addition, the dissolution concentration depends upon the temperature of water, and the concentration of nitrogen that can be dissolved decreases with increasing temperature of water.

When this pure water is heated to 80° C., the concentration of dissolvable nitrogen becomes 6.7 ppm. Excessive nitrogen corresponding to the difference of concentration of 11.1 ppm results in generating bubbles.

Generation of bubbles due to heating can be prevented by removing the dissolved gas in the pure water down to below the saturation concentration using a film deaeration apparatus, but bubbles can be generated even in concentrations below this saturation concentration when the high-frequency ultrasonic wave is superimposed. It is thus more desirable to remove the dissolved gas to the optimum concentration region.

Fortunately, by connecting to the outlet of a pure water producing apparatus a film deaeration apparatus in which a hydrophobic film is disposed at a portion corresponding to the interface and in which the primary-side pure water is deaerated by decreasing the partial pressure on the secondary side by reduction of pressure with a vacuum pump, and by using the system, it is possible even now to obtain the pure water having the concentration of dissolved oxygen in the limit concentration region of 5 ppb or less for the pure water of 60° C. or less.

Use of the pure water from which the dissolved gas in pure water is removed in this way suppresses the generation of bubbles due to the high-frequency ultrasonic wave, even with heating of pure water, and suppresses the fixing of bubbles to the hydrophobic substrate surface.

Prevention of the generation of bubbles enables further removal of dust particles in the same cleaning time as before without performing the lifting operation of hydrophobic porous silicon substrate, and this effect is not degraded by heating of pure water during cleaning.

As described above, the present invention enabled only the high-frequency ultrasonic wave and the pure water from which the dissolved gas was removed, to remove the dust particles on the surface at high efficiency and in a short time while avoiding collapse of the porous silicon.

The action of the present embodiment is also effective to substrates other than silicon if they are substrates to be cleaned, having a similar fine and fragile porous structure, and can demonstrate the same effect. The action and effect of the present invention are not limited to silicon.

(Embodiment 3)

In Embodiment 3, the porous silicon surface is subjected to a hydrophilic process and then to ultrasonic cleaning. The ultrasonic cleaning of a porous silicon surface is carried out in the high frequency band of from 200 kHz to 8.4 MHz, preferably in the range of from 600 kHz to 2 MHz. More preferably, cleaning is carried out using the high-frequency ultrasonic wave in the frequency band classified megasonic ranging from 800 kHz to 1.6 MHz, thereby avoiding the risk of collapse of the porous structure.

However, observed in the above-stated cleaning method by the present inventors is the phenomenon that bubbles are also generated from the pure water in the case of application of high-frequency ultrasonic waves and that the bubbles adhere, particularly, to the hydrophobic substrate surface.

The bubbles impede propagation of ultrasonic waves so as to degrade the cleaning effect and draw fine dust particles in the pure water to the gas-liquid interface, so as to contaminate the substrate surface with the dust particles. Adhesion of bubbles to the substrate surface is rarely observed on the hydrophilic surface, whereas adhesion and fixing of bubbles occurs on the hydrophobic surface. It is thus not easy to perfectly prevent adhesion of dust particles to the hydrophobic surface due to the bubbles, by the flowing water and ultrasonic wave in the cleaning bath.

Figure 11:
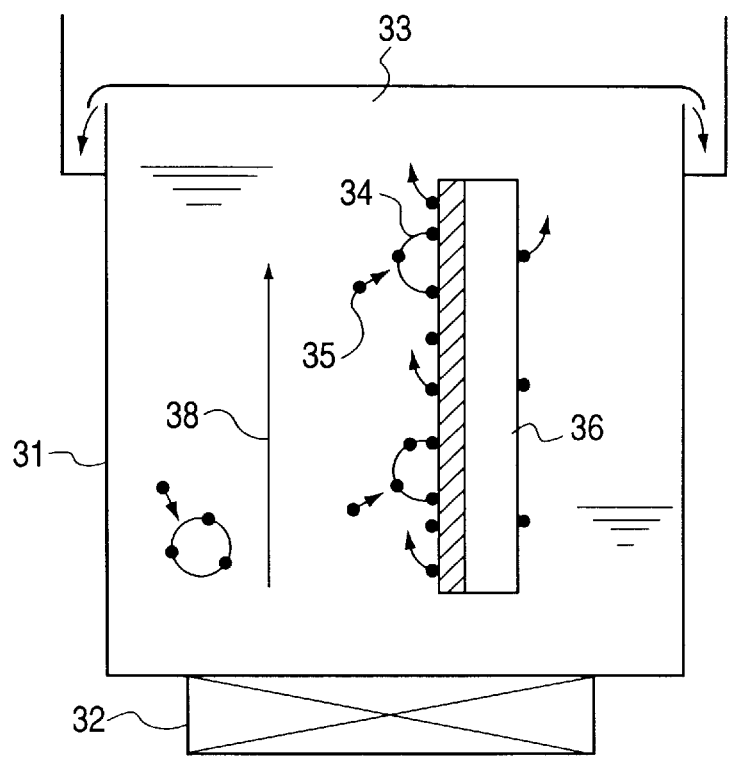
FIG. 11 is a conceptual drawing to explain the influence of bubbles in pure water upon high-frequency cleaning of a hydrophobic substrate.

This will be described in further detail. FIG. 11 shows adhering states of bubbles and moving states of dust particles on the hydrophobic substrate, where the high-frequency wave is superimposed on the pure water. In the figure, reference numeral 31 designates a quartz high-frequency cleaning bath, 32 a high-frequency vibrating plate, 33 pure water not subjected to deaeration of dissolved gas, 34 bubbles, 35 dust particles, 36 a porous silicon substrate having a hydrophobic surface, and 38 a high-frequency progressive wave.

The low-frequency ultrasonic cleaning normally experiences generation of bubbles due to the cavitation in the pure water, whereas the high-frequency cleaning involves reduced cavitation, but experiences deaeration of dissolved gas due to high-frequency vibration in the pure water, thereby generating bubbles. The source of these bubbles is the dissolved gas such as oxygen and nitrogen dissolved in the pure water.

The gas-liquid interface of bubbles has higher energy than the liquid and thus captures fine dust particles in the pure water. In addition, the hydrophobic substrate surface is stable in terms of energy with respect to the gas, and the bubbles are thus likely to adhere thereto. Since the pure water cannot intrude between the bubbles and the substrate surface, it is difficult to remove the bubbles from the substrate. For example, while the bubbles are as small as about 1 mm in diameter, they cannot move on the substrate surface only by their own buoyancy.

When the high-frequency ultrasonic wave is applied to the substrate surface, the surface receives kinetic energy in the direction of the progressive wave, but the energy is insufficient to move the bubbles. In this way, the bubbles are fixed to the substrate surface.

Adhesion of the bubbles to the substrate surface promotes collection of fine dust particles in the pure water, and further adhesion of bubbles thereto causes the bubbles to move on the substrate surface by their own buoyancy, which makes the collected dust particles adhere to the substrate surface along the moving path thereof, thereby contaminating the substrate.

In addition, the bubbles adhering to the substrate surface impede propagation of high-frequency waves to the substrate surface per se, thereby degrading the cleaning effect. Namely, generation of bubbles in the high-frequency cleaning of a substrate having the hydrophobic surface will result in degrading the cleaning effect, because the high-frequency cleaning of dust particles on the substrate surface advances at the same time as the contamination of the substrate by the dust particles in the pure water due to the adhesion of bubbles.

When cleaning takes place with the ultrasonic wave superimposed on the pure water shower, generation and adhesion of bubbles is also observed. If the pressure of the shower is increased for removing the bubbles, it might cause collapse of the fragile porous surface.

The present inventor conducted research to improve the cleaning effect and found the method of Embodiment 1 for softly removing the bubbles by regularly lifting the substrate out of the pure water bath during cleaning and the method of Embodiment 2 for preliminarily deaerating the dissolved gas from the pure water used for cleaning so as to prevent the generation of bubbles per se, thereby obviating the need for the lifting operation of the substrate out of the pure water bath.

Now described is the ultrasonic cleaning of Embodiment 3 for the porous silicon surface processed by the hydrophilic process.

Figure 13:
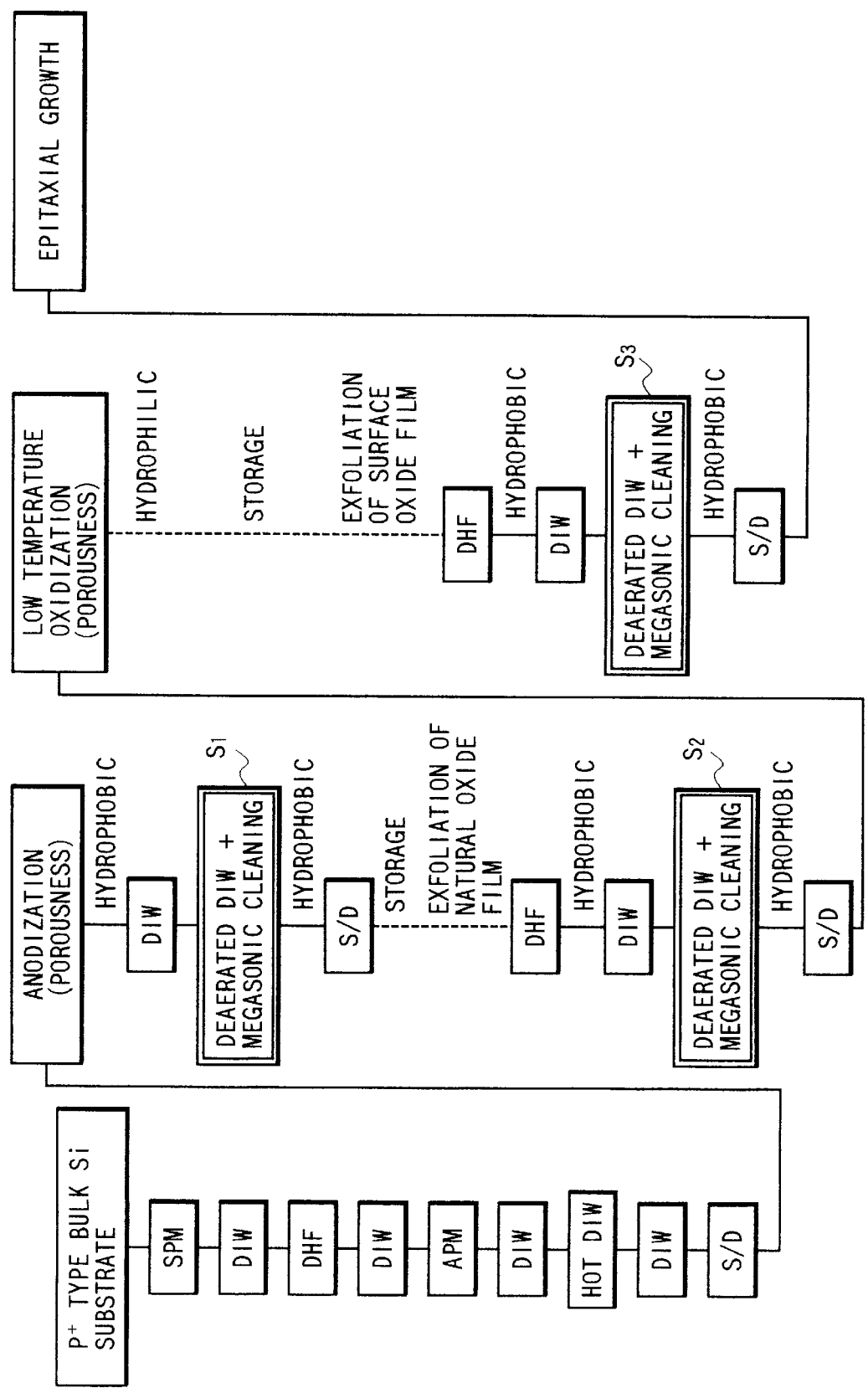
FIG. 13 is a drawing to show an example of the flow of cleaning of the porous silicon substrate with pure water.

FIG. 13 shows an example of a flowchart of the fabrication process up to epitaxial growth on porous silicon and the cleaning method. In the drawing, SPM stands for $H_2SO_4/H_2O_2$ mixture, DIW for pure water, DHF for dilute HF solution, APM for $NH_4OH/H_2O_2/H_2O$ mixture, and S/D for spin drying.

Cleaning of bulk silicon substrates before anodization is cleaning with chemicals, as before, but the apertures of holes of the porous structure are exposed in the substrate surface from after formation of porous silicon by anodization to epitaxial growth.

As apparent from the flowchart, the chemicals normally used for cleaning of bulk silicon substrates, such as SPM, APM, or HPM ($HCl/H_2O_2/H_2O$ mixture), cannot be used while the apertures of holes of porous silicon are exposed in the surface. Only DHF and pure water can be used in that period.

As described previously, many dust particles adhere to the surface in the forming process of porous silicon by anodization.

Figure 16:
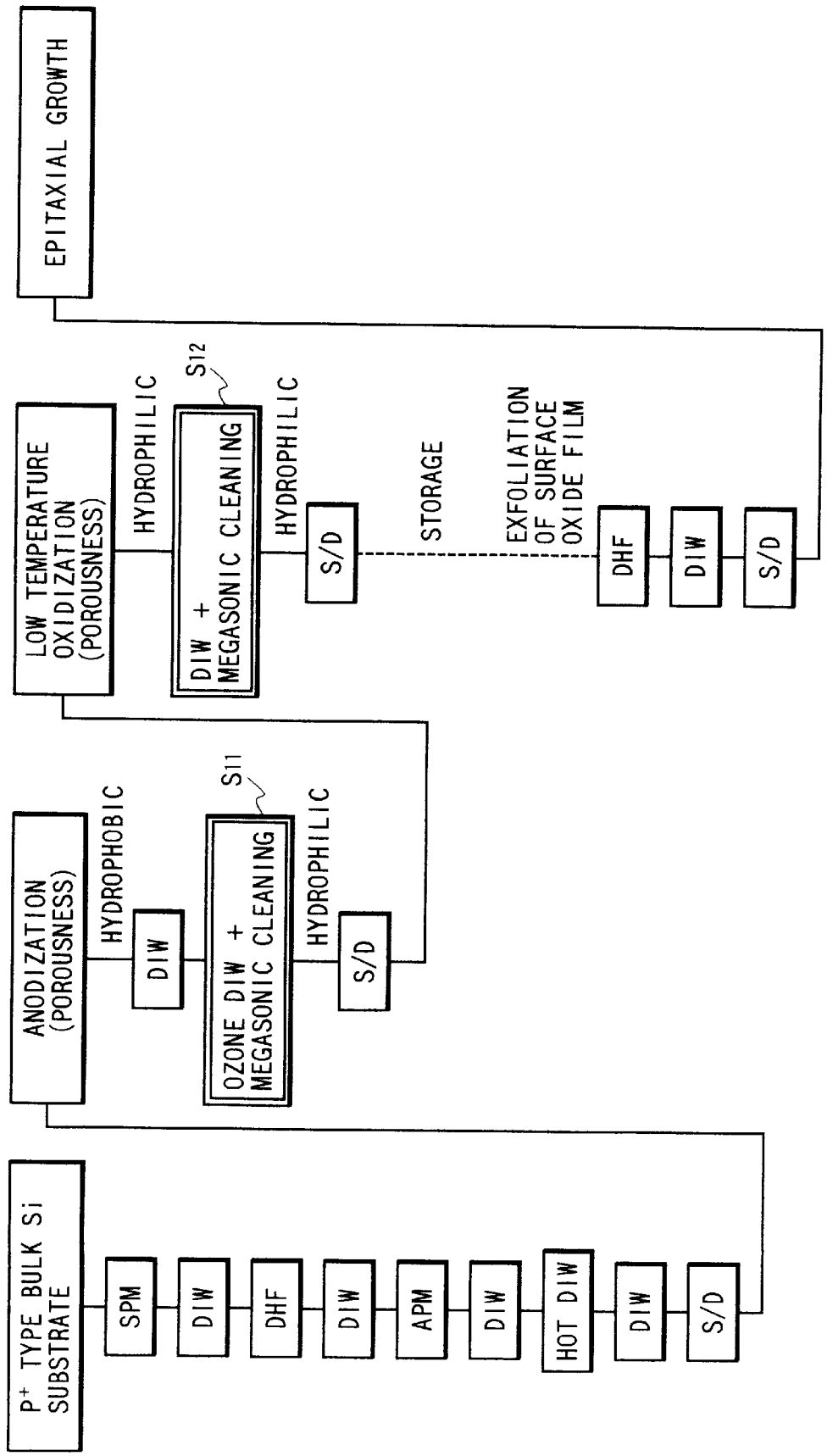
FIG. 16 is a drawing to show an example of the flow of cleaning of the porous silicon substrate.

In the case wherein a single-crystal silicon film is epitaxially grown on a surface of a porous silicon substrate, an oxide film is formed over the internal wall surfaces of the porous structure (by forming a native oxide film or by a low-temperature oxidation step of FIG. 16) in order to decrease the structural change of the porous structure in the heating process at high temperatures. Further, the epitaxial growth is carried out after at least the oxide film over the porous surface (of silicon substrate) is selectively removed immediately before the growth. In this case, the oxide film is left on the internal wall surfaces of holes of the porous structure. Specifically, the oxide film on the porous silicon surface is removed by immersion in DHF for a short time, the substrate is drawn up out of the DHF bath before the DHF solution deeply intrudes into the holes of the porous structure, and the substrate is rinsed with pure water.

For example, before the epitaxially grown layer is formed on the porous silicon by the thermal CVD process at the temperature of about 1000° C., an oxide film is formed by low-temperature oxidation of the internal walls of the holes of the porous silicon at 400° C. and for one hour.

However, adhesion of new dust particles numbering 100 or so is observed on the surface in the substrate after the thermal oxidation step. Such dust particles are considered to be generated by abrasion due to scrubbing between a quartz boat with substrates being arranged thereon and a quartz furnace tube.

Since the oxide film on the porous silicon surface is removed by etching with dilute HF solution immediately before the epitaxial growth, these dust particles can be considered lifted off or removed from the surface at the same time as the oxide film is removed.

In practice, however, the number of dust particles after the etching with dilute HF solution changes minimally or even increases on the contrary. This is because the porous surface becomes hydrophobic after removal of the oxide film, and the dust particles floating in the etching bath are adsorbed to the substrate by flowing water charging of the substrate upon lift of substrate, thereby again adhering to the substrate.

Incidentally, since anodization uses the high-concentration HF electrolyte solution, the porous silicon surface becomes hydrophobic, as shown in FIG. 13, after the anodization, as after the removal of oxide film with DHF after the low-temperature oxidation.

Figure 12:
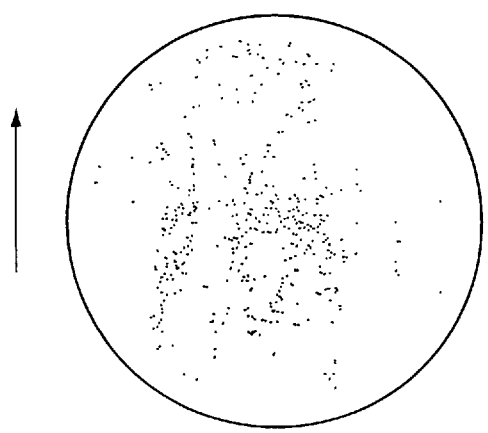
FIG. 12 is a plan view to show adhering dust particles after the high-frequency cleaning where bubbles adhere to the hydrophobic substrate.

As described previously, if bubbles are generated during high-frequency cleaning with pure water, the bubbles will adhere to the surface of the hydrophobic substrate so as to impede the cleaning action and to cause the collection of dust particles in the pure water onto the substrate surface, thus contaminating the surface. FIG. 12 shows the result of inspection where a state of adhesion of dust particles to the substrate surface was checked with a dust particle inspection system after the hydrophobic, porous silicon substrate was subjected to the high-frequency cleaning in pure water without performing the lift of substrate and the deaeration process of pure water. In FIG. 12, the arrow represents the rise direction of bubbles. The high-frequency progressive wave is also applied so as to travel in the same direction. Adhesion contamination of dust particles is recognized along the rise path of bubbles adhering to the substrate surface.

For this reason, it is desired to perform the regular lift operation of substrate during the high-frequency cleaning when the pure water without deaeration is used or to perform the high-frequency cleaning with pure water from which the dissolved gas in the pure water is deaerated. This is the reason why the high-frequency cleaning is carried out with the deaerated pure water (at steps $S_1$, $S_2S_3$) in FIG. 13.

In cleaning of a substrate, however, the method for regularly lifting the substrate out of the pure water bath during cleaning would create very cumbersome work, for example, where cleaning relies on worker labor.

Deaeration of dissolved gas in the pure water can compensate for the gas concentrations at the exit of the deaerating apparatus, but in the case of reserving water in a pure water high-frequency cleaning bath, re-dissolution of oxygen and nitrogen occurs from the atmosphere within a short time even under flow of water. Thus, some measure becomes necessary for the structure of cleaning bath, gas seal, and the like in order to compensate for the concentrations of dissolved gas in the pure water in the cleaning bath.

After further research, the present inventor achieved the present invention. Specifically, the cleaning method of a porous surface according to Embodiment 3 of the present invention is the method for oxidizing the porous surface, into a hydrophilic surface so as to facilitate occurrence of the cleaning effect in the high-frequency cleaning with pure water and for removing the dust particles of a substrate surface from the hydrophilic surface by the pure-water high-frequency cleaning. When a single-crystal silicon film is epitaxially grown on the porous silicon surface after the etching removal with dilute HF solution, immediately before the epitaxially growth, of the clean surface oxide film of a porous silicon substrate from which such dust particles have been removed, the single-crystal silicon film with good quality can be formed.

(Embodiment 4)

The cleaning method of a porous surface according to Embodiment 4 of the present invention is a method for oxidizing the porous surface, into a hydrophilic surface so as to facilitate occurrence of the cleaning effect in the high-frequency cleaning and for superimposing the high-frequency ultrasonic wave on a liquid for cleaning of the porous surface made hydrophilic, thereby removing the dust particles on the substrate surface.

The cleaning method of a porous surface according to the present embodiment is not limited to specific materials of substrate if the substrate has the a porous surface. For example, applicable materials include the semiconductor materials of Si, GaAs, and the like, ceramic materials, and so on. Further, the cleaning method of a porous surface according to the present invention can also be applied for removing the dust particles adhering to the substrate surface having such structure that a film of semiconductor thin film of amorphous Si, polycrystal Si, GaAs, or the like or a layer of metal thin film is deposited by chemical vapor deposition or the like on the internal wall surfaces of pores of Si porous substrate, as shown in FIG. 2.

In the case wherein the layer of the semiconductor thin film or the metal thin film is formed directly on the internal wall surfaces of pores of the porous substrate as shown in FIG. 2, the layer of semiconductor thin film or metal thin film may be formed after the substrate surface oxide film and the internal wall oxide film formed by the hydrophilic process are removed.

As described previously, porous silicon immediately after anodization has a hydrophobic surface, because the concentrated HF mixture solution is used as an electrolyte solution. When an oxide film is formed on this surface, this surface becomes hydrophilic. If the surface is hydrophilic and even if bubbles are generated in high-frequency cleaning with non-deaerated pure water, the bubbles will not adhere to the substrate surface, whereby the high-frequency cleaning with pure water can demonstrate the cleaning effect with high removing rate.

Figure 14:
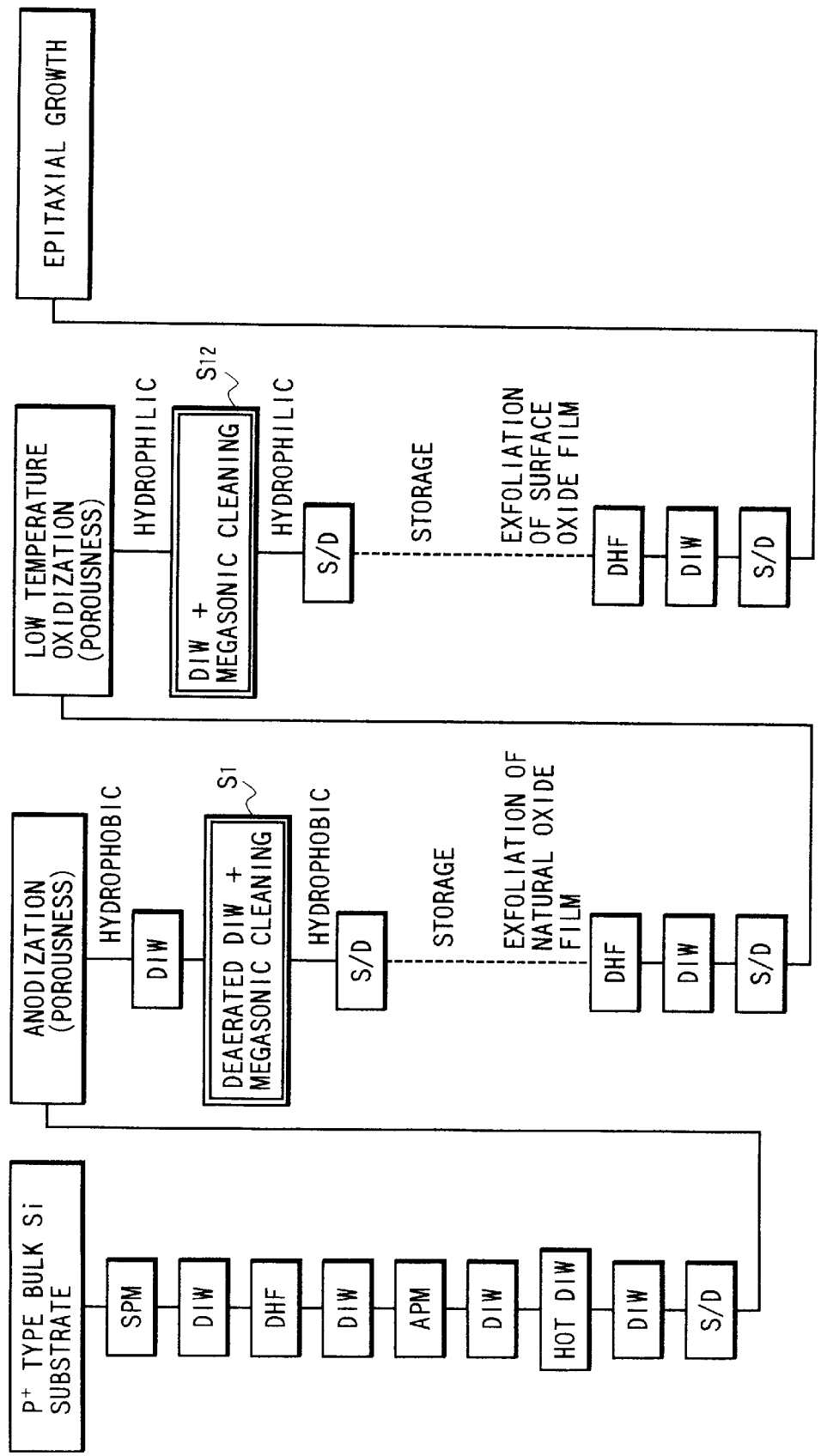
FIG. 14 is a drawing to show an example of the flow of cleaning of the porous silicon substrate.

Specifically, when the substrate is made hydrophilic by low-temperature oxidation before the cleaning step $S_{12}$ as shown in FIG. 14, even with the generation of bubbles on the hydrophilic substrate surface similarly, the substrate surface is stable and shows a good wetting property to pure water and, therefore, the substrate surface is always covered with pure water, thus preventing the bubbles from adhering thereto.

Accordingly, the dust particles collected by the bubbles are prevented from transferring to the substrate and do not impede propagation of high-frequency wave, thus demonstrating the cleaning effect sufficiently.

As described, the pure-water high-frequency cleaning of a hydrophilic substrate does not need to perform the countermeasure of the regular lift operation of substrate, the deaeration process of pure water, or the like, and the high cleaning action can be expected by keeping the substrate immersed in the pure-water high-frequency bath during cleaning even with the generation of bubbles as in the case of the deaerated pure water.

It is well known that the surface of silicon oxide film is hydrophilic. However, the present inventor discovered that the low-temperature-oxidized surface of porous silicon is also hydrophilic.

As already described with FIG. 13, this low-temperature oxidation process is carried out as a process before epitaxial growth on porous silicon in order to decrease the structural change of the porous structure during the heating process at high temperatures, which is not one especially introduced for the cleaning of the present invention.

The low-temperature-oxidized film is also formed by intrusion of oxide atom into the crystal lattice of substrate surface, similarly as in thermal oxidation, and if the dust particles are present on the surface, it will be also formed at the interface between the particles and the substrate. The oxide film is removed from the surface by etching of oxide film together with the dust particles having adhered during the oxidation step.

However, the dust particles will be brought into the etching bath, unless the surface of oxide film before etching is clean. It will cause the dust particles to re-adhere to the substrate after etching.

For this reason, the cleaning after the oxidation step is carried out preferably before exfoliation of the oxide film by etching.

Accordingly, in FIG. 14, porous silicon is made hydrophilic by oxidation or the like. Thereafter, it is subjected to the high-frequency cleaning with pure water to effectively remove the dust particles from the surface and to create a clean oxide film surface. Exfoliation of the surface oxide film with the dilute HF solution is carried out immediately before epitaxial growth or the like. Then the epitaxial growth or the like is carried out, thus providing a clean porous silicon surface that can be used in the semiconductor processes.

In addition, the dust particles on the oxide film surface, which might be a cause of re-adhesion of dust particles in the dilute HF etching step, are already removed so as to secure the clean oxide film surface, whereby the dust particles are rarely brought into the dilute HF liquid bath, thus relieving the problem of re-contamination.

As described, the difference of the fabrication method of FIG. 14 from FIG. 13 is that the high-frequency cleaning with pure water carried out on the hydrophobic surface after the oxide film removing step of porous silicon surface with the dilute HF solution between the thermal oxidation step and the epitaxial growth step is changed to the pure-water high-frequency cleaning carried out on porous silicon having the hydrophilic surface between the oxidation step and the dilute HF etching step.

With this change of timing of cleaning, the dust particles on the porous silicon surface can be removed effectively without a need for the countermeasure against adhesion of bubbles, such as the regular substrate lift operation during cleaning or the deaeration of pure water.

The hydrophilic process may be made using the oxidation action with ozone water or hydrogen peroxide water described hereinafter, instead of the thermal oxidation. In this case, though immersion of the substrate is sufficient, it is more preferable to apply the high-frequency ultrasonic wave thereto. Examples of the hydrophilic process include dry oxidation processes, such as atmospheric pressure oxidation in a high-concentration ozone gas atmosphere or in a high-concentration oxidizing atmosphere, or a process by plasma oxidation under reduced pressure using the aforementioned gas as a base raw material.

On the other hand, there are many dust particles adhering to the hydrophobic surface after anodization. When it is put into a thermal oxidation system, the dust particles, depending upon the types thereof, would firmly stick to the surface, and would be a cause of contamination of the oxidation system.

In the fabrication flow shown in FIG. 14, cleaning takes place in combination of the deaeration process of dissolved gas in the pure water with the high-frequency cleaning with pure water of a hydrophobic surface (step $S_1$).

Figure 15:
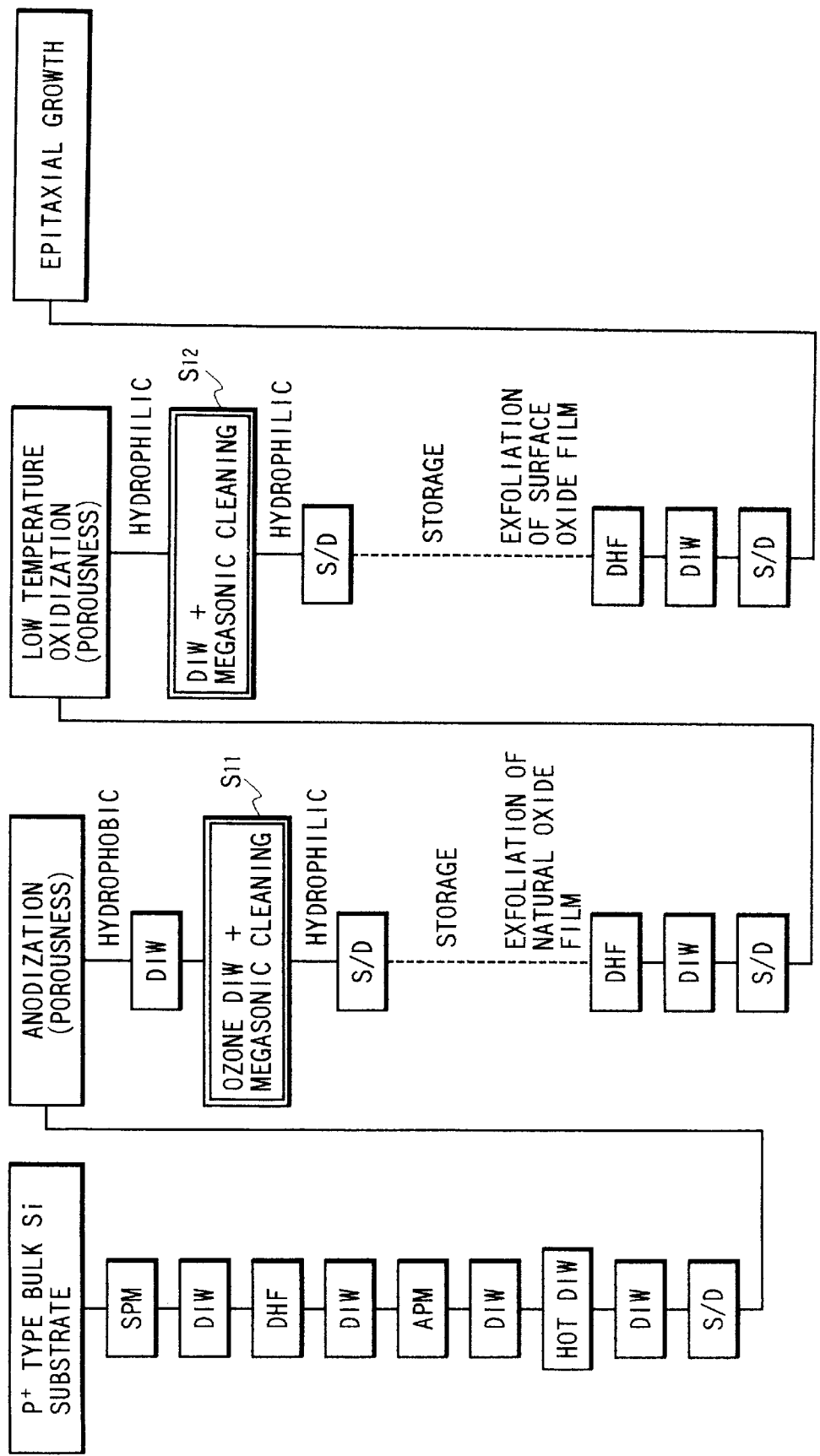
FIG. 15 is a drawing to show an example of the flow of cleaning of the porous silicon substrate.

Such a cleaning step including the deaeration process can be replaced by the cleaning method of the present invention as shown in FIG. 15. The step $S_{11}$ of FIG. 15 is according to the cleaning method of a porous surface based on the second embodiment of the present invention, wherein high-frequency cleaning takes place with pure water in which ozone is dissolved.

As well known, the pure water with ozone dissolved therein has strong oxidizing power. The removing effect of organic matter greatly depends upon the oxidizing action of organic matter. The strong oxidizing action of the ozone pure water can be used as the hydrophilic process of a hydrophobic surface and has an effect to create the hydrophilic surface by oxidizing the porous silicon surface after anodization. If the hydrophilic surface thus created is subjected to the high-frequency cleaning, the hydrophilic process and high-frequency cleaning will be performed in one step.

In addition, even if the ozone pure water intrudes into the pores of porous silicon like the pure water, it can be eliminated readily as vapor or oxygen gas by heating after the process, thus leaving no negative effect on the subsequent steps.

The oxide film over the porous silicon surface and over the internal walls of holes made by the ozone water containing ozone in the concentration of about 10 to 13% is removed by etching with DHF, which was carried out conventionally for the purpose of removing the native oxide film prior to the low-temperature oxidation step.

The high-frequency cleaning with the ozone pure water demonstrates the effect on the hydrophobic porous silicon surface, but no problem will arise if it is applied to cleaning of oxidized porous silicon already having the hydrophilic surface. Accordingly, the cleaning method can be used for cleaning of porous silicon both after anodization and after low-temperature oxidation.

Further, from the viewpoint of the hydrophilic process of porous silicon by wet oxidation, it is also possible to employ high-frequency cleaning with hydrogen peroxide solution ($H_2O_2/H_2O$) of about 2% or less diluted with pure water, in addition to the ozone water.

This is also cleaning with chemicals, but hydrogen peroxide can be eliminated readily even if it intrudes into the pores of porous silicon. Thus, hydrogen peroxide leaves no negative effect on the subsequent steps.

The fabrication flow of FIG. 15 may be modified as shown in FIG. 16, wherein low-temperature oxidation takes place after the high-frequency cleaning with pure water in which ozone is dissolved. An oxide film is formed by the ozone pure water on the porous silicon surface after anodization, and the low-temperature thermal oxidation process achieves uniform oxidation proceeding deeply into the holes of the porous inner walls. In addition, there is no need to dare to remove the oxide film formed by the ozone pure water. Thus, the oxide film exfoliation step before the low-temperature thermal oxidation becomes unnecessary, thus further decreasing the steps as shown in FIG. 16.

It is known that the surface of a hydrophobic substrate becomes hydrophilic after APM cleaning, but APM cannot be used for the hydrophilic process of hydrophobic porous silicon as described previously.

A semiconductor substrate made clean in a manner of the present invention as explained above, which substrate has a porous surface, may be suitably used for a preparation of a semiconductor device such as MOS-FET. FIGS. 29A through 29F are cross-sectional views to schematically show an example of processes of such a semiconductor device.

Figure 29A:
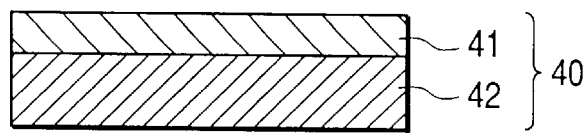
FIGS. 29A, 29B, 29C, 29D, 29E and 29F are schematic cross-sectional views to illustrate successive stages in the processing of a substrate in preparation for semiconductor device manufacture.

As shown in FIG. 29A, silicon substrate 40, which has been made clean in the above-explained manner, is comprised of non-porous silicon single crystal region 42 (i.e., bulky silicon region) remaining without being made to be porous and porous silicon single crystal layer 41. First, silicon substrate 40 was heated at 400° C. for 1 hr in an oxygen atmosphere, whereby oxide films were formed on the inner walls of pores of the porous silicon single crystal layer 41 and a surface of porous silicon single crystal layer 41, respectively. It is for preventing silicon atoms from migration in the pores as the result of the raising of temperature in a process of forming an epitaxial layer at a later stage and so forth and for preventing the pores from filling up as the result of the migration that the films were provided.

Figure 29B:
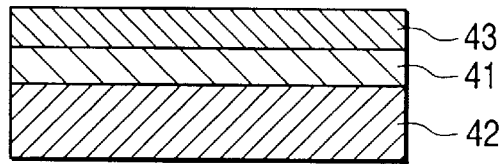

Next, the surface of porous silicon single crystal layer 41 was treated with hydrofluoric acid to remove the oxide film on the surface of porous silicon single crystal layer 41, leaving the oxide films on the inner walls of the pores. Then, non-porous silicon single crystal layer (epitaxial layer) 43 of 0.3 µm in thickness was made to grow epitaxially on porous silicon single crystal layer 41 by CVD method, as shown in FIG. 29B. Any of molecular beam epitaxial method, plasma CVD method, reduced pressure CVD method, light CVD method, liquid-phase growth method and sputtering method can be used for forming such non-porous silicon single crystal layers as layer 43. Although it is possible to set up arbitrarily the thickness of non-porous silicon single crystal layer 43 without limiting it to the above-mentioned value, the layer is typically formed in a range of 100 nm through 2 µm in thickness.

Figure 29C:
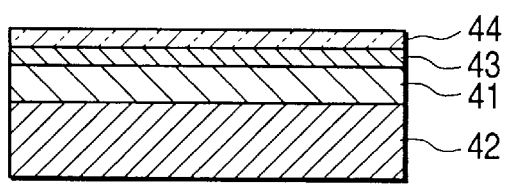

Next, as shown in FIG. 29C, the surface of non-porous silicon single crystal layer 43 was partially oxidized to form an oxide film of 200 nm in thickness as insulating layer 44. Although it is also possible to set up arbitrarily the thickness of insulating layer 44 without limiting it to the above-mentioned value, the layer is typically formed in a range of 50 nm through 2 µm in thickness.

Figure 29D:
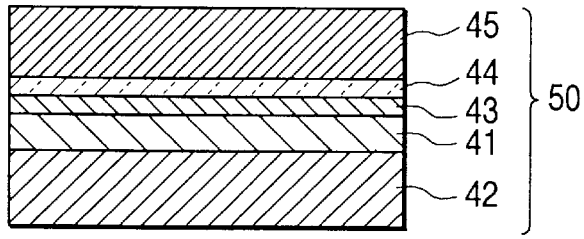

Next, as shown in FIG. 29D, another silicon substrate 45 was laid on top of insulating layer 44, and then the laid faces of them were stuck on each other. Next, the resultant was heat treated at 1180° C. for 5 minutes to adhere the faces to each other. As the result, silicon substrate 40 as the first substrate and silicon substrate 45 as the second substrate were adhered to each other through insulating layer 44, so that multi-layer structure 50 wherein non-porous silicon single crystal layer 43 was located was formed as shown in FIG. 29D.

Figure 29E:
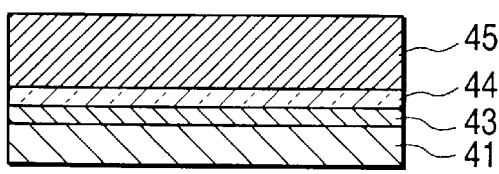

Next, as shown in FIG. 29E, non-porous silicon single crystal region 42 was removed from the above-mentioned multi-layer structure 50 to expose porous silicon single crystal layer 41 in a manner as described in the following: First, non-porous silicon single crystal layer 42 was ground by a grinder so as to leave the layer 42 in a slight thickness from the border with porous silicon single crystal layer 41, followed by removing the remaining non-porous silicon single crystal region 42 by means of dry-etching. Besides such a grinding method, it is possible to employ a method of separating non-porous silicon single crystal region 42 from multi-layer structure 50 on the basis of porous silicon single crystal layer 41 as the border. Since the mechanical strength of porous silicon crystal layer 41 is lesser than that of non-porous silicon single crystal region 42, non-porous silicon single crystal layer 43 and so forth, it is possible to separate non-porous silicon single crystal region 42 without causing damage to non-porous silicon single crystal layer 43, by giving between silicon substrate 45 and non-porous silicon single crystal region 42 a force of pulling apart in a direction perpendicular to the surface of the substrate or a shear force in a direction parallel to the surface of the substrate. As an example of other methods of separating non-porous silicon single crystal region 42 capable of being used, methods of inserting a wedge-shaped member or blowing water jet to porous silicon single crystal layer 41 are exemplified. Further, another method may be used, which is comprised of setting up in advance a region of which the porosity showing a ratio of a volume of pores to a volume of silicon is larger than that of other regions, and then separating non-porous silicon single crystal region 42 using the region as a separation face. Thus, such methods of separating non-porous silicon single crystal region 42 as mentioned above are capable of baring porous silicon single crystal layer 41 in a short time, so that the semiconductor device can be manufactured efficiently. Further, it is possible to use another method comprised of removing from the separated non-porous silicon single crystal region 42 a portion of porous silicon single crystal layer 41 which remains after the separation and then flattening the region as the occasion demands, followed by making it porous partially, to utilize non-porous silicon single crystal region 42 as such silicon substrate 40 as shown in FIG. 29A.

Figure 29F:
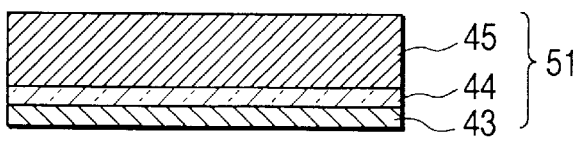

Next, as shown in FIG. 29F, porous silicon single crystal layer 41 was removed by etching, to form on silicon substrate 45 so-called SOI (silicon-on-insulator) substrate 51, which has thin non-porous silicon single crystal layer 43 through insulating layer 44. A chemical etching method where an aqueous solution containing hydrofluoric acid and hydrogen peroxide water is used as an etchant was employed for the etching of porous silicon single crystal layer 41. The etching rate by such an etchant on porous silicon is $1 \times 10^5$ times greater than that on non-porous silicon. Accordingly, it is possible to remove selectively and controllably porous silicon single crystal layer 41, leaving flat non-porous silicon single crystal layer 43 which is uniform in thickness.

Lastly, SOI substrate 51 shown in FIG. 29F was heat treated at 1100° C. for 1 hr in a hydrogen atmosphere, to further flatten the surface of non-porous silicon crystal layer 43. Mean square roughness of the surface after this heat treatment measured by an interatomic force microscope was about 0.2 nm.

Using non-porous silicon single crystal layer 43 of SOI substrate 51 formed in such a manner as described above, it is possible to manufacture a semiconductor device such as MOS-FET, DRAM, solar cell and so forth through a well-known semiconductor process.

In the above-mentioned example, it was a silicon substrate that was used as the second substrate. However, also a photo-transmittable substrate such as quartz substrate and glass substrate can be used. When such a photo-transmittable substrate is used therein, the product can be suitably used for photo-sensor, liquid crystal display and so forth. When the second substrate is comprised of an insulating material such as quartz substrate and glass substrate, or when using as the second substrate a silicon substrate wherein an insulating layer such as an $SiO_2$ layer was formed on the adhered face, insulating layer 44 in FIG. 29C is not indispensable. However, if non-porous silicon single crystal layer 43, on which a semiconductor device is to be formed in a future process, should be separated from the adhered face as far as possible to protect it from an influence of an impurity and so forth, it is desirable to form an insulating layer on non-porous silicon single crystal layer 43.

EXAMPLES

The present invention will be described in further detail with examples. In the present invention, water satisfying the following conditions has been employed as the pure water:

Resistivity [MΩ•cm]>17.5

Particle having more than 0.1 µm in diameter [pieces/ml] <20

Bacteria [pieces/100 ml]<50
Total silica [ppb]<5
TOC [ppb]<50
DOC [ppb]<50
Metallic ion [ppt]<500
Examples 1 and 2 are examples of Embodiment 1.

Example 1

Porous silicon substrates used in cleaning were prepared by forming a porous silicon layer 10 μm thick on one side of a p$^+$-type 5-inch-diameter silicon substrate RCA-cleaned, by anodization, and then they were subjected to pure-water rinse and spin drying. Then the number of dust particles was measured for each sample using a surface dust particle inspection system.

Figure 17:
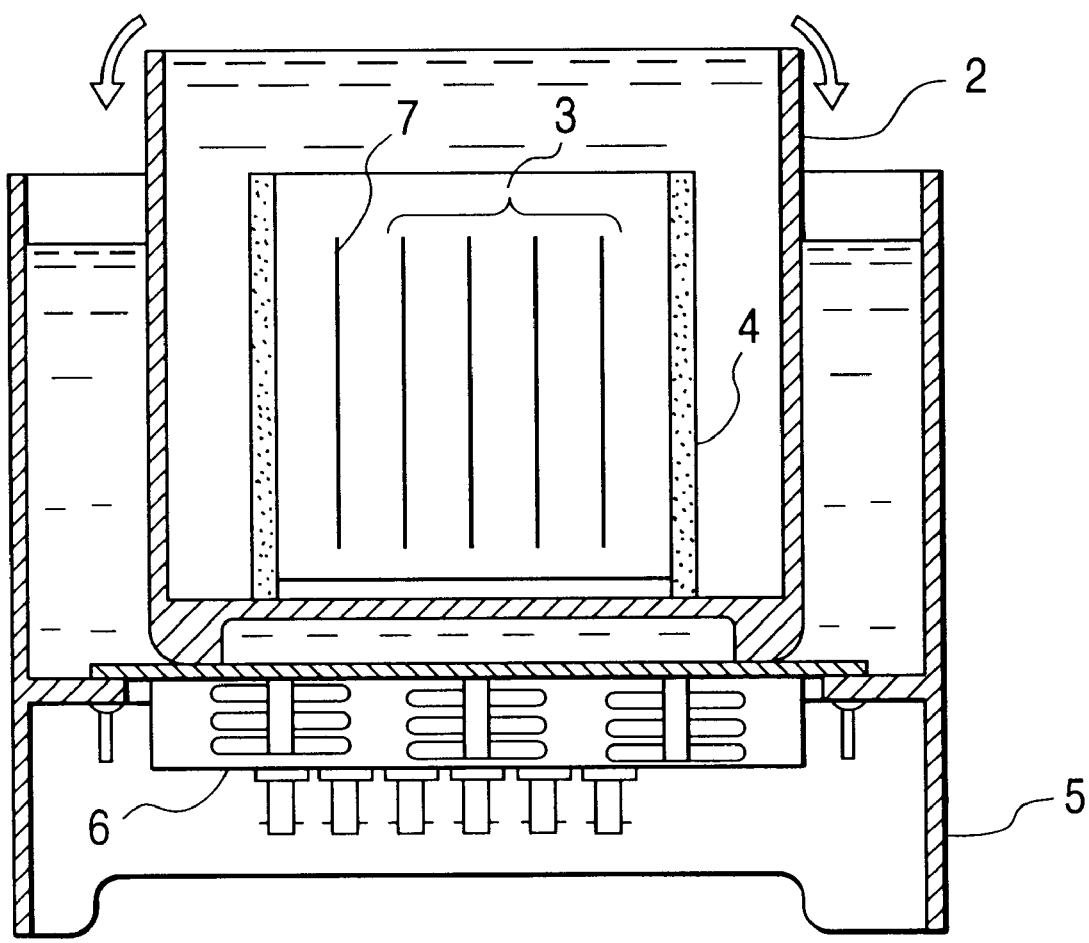
FIG. 17 is a cross-sectional view to show an example of a high-frequency ultrasonic cleaning apparatus of the present invention.

Next, the above porous silicon substrates 3 were set in the order of anodization batches on a cleaning carrier 4 in a quartz bath 2 under over flow of pure water 1 as shown in FIG. 17. Then they were cleaned as applying the high-frequency ultrasonic wave of the frequency of about 1 MHz and the power of 150 W in parallel with the substrates 3 from an oscillator 6 of high-frequency ultrasonic bath 5 through the quartz bath 2.

A bulk silicon substrate 7 RCA-cleaned was placed as a dummy for cleaning at the carrier end, and the substrates were cleaned in the pure water for 20 minutes, eliminating the bubbles adhering thereto by lifting the substrates together with the carrier 4 out of the pure water every five minutes.

For evaluating the removing effect of dust particles, the substrates were subjected to spin drying after cleaning, and then measurement of dust particles was carried out. The same cleaning was again conducted for 20 minutes more, and then measurement of dust particles was conducted.

The measurement of dust particles was evaluated in the mode to measure dust particles of sizes not less than 0.3 μm, attained from the laser reflection intensity distribution, in the 5-inch substrate surface.

Figure 18:
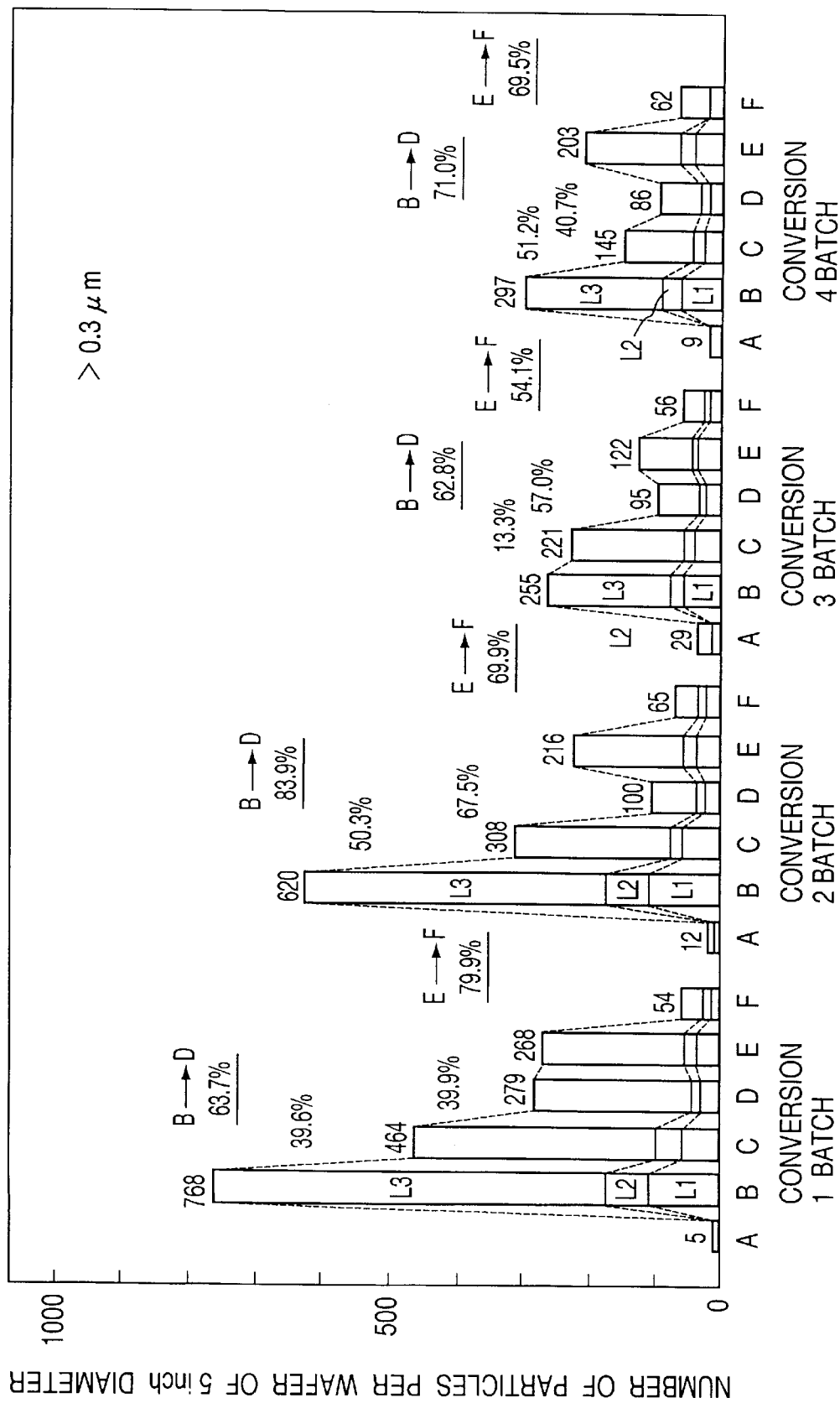
FIG. 18 is a graph to show the numbers of dust particles on the surface of porous silicon from after anodization to after low-temperature oxidation, where the high-frequency ultrasonic cleaning of the present invention is carried out.

FIG. 18 shows changes in the number of dust particles with this series of cleanings. In this figure, values of % indicate removal rates. FIG. 18 does not include data of the dummy 7 at the carrier end.

As shown in FIG. 18, it is seen that the dust particles greatly increase after anodization (indicated by B in the drawing), as compared with the number of dust particles on the substrate surface after RCA cleaning (indicated by A in the drawing) (which is the same data as in FIG. 2 described previously). The classification of L1, L2, and L3 in the bar graph of FIG. 18 indicates rough classification of sizes of dust particles based on laser reflection intensities from the dust particles, and they become greater in the order of L1, L2, and L3 (i.e., L1<L2<L3).

Since the dummy substrate was placed at the carrier end, the data of anodization 1 batch was not dependent on contamination from the carrier, but on the order of batch of anodization.

Porous silicon conventionally used was the one cleaned only by pure water rinse and thus having the surface contaminated with dust particles.

When it was cleaned for 20 minutes by the high-frequency ultrasonic cleaning in the pure water according to the present invention (C in the drawing), 13% to 51% of dust particles were removed from the surface. Further, the adhering bubbles were eliminated similarly by lifting the substrates together with the carrier 4 every five minutes. The 20-minute cleaning (D in the drawing) removed 63% to 84% of dust particles, as compared with the data after the pure water rinse (B in the drawing) following anodization. The data from the dust particle inspection system after cleaning showed no roughness change due to collapse of the porous silicon substrate.

Exclusion of the removal of bubbles resulted in observing that fine dust particles, particularly of the L1 size, collectively adhered to the substrate, so as to traverse the substrate along the bubble rise direction (coincident with the ultrasonic propagating direction in the example).

Example 2

Next described is an example of the high-frequency ultrasonic cleaning after the low-temperature oxidation and the removal of surface oxide layer, which are preliminary treatments indispensable to epitaxial growth on the porous silicon surface.

The porous silicon substrates cleaned by the high-frequency ultrasonic cleaning with pure water after anodization in Example 1 (D in the drawing) were subjected to the low-temperature oxidation in an oxygen atmosphere at 400° C. and for one hour (E in the drawing), and measurement of dust particles was carried out. Then new dust particles adhered thereto as shown in FIG. 18.

The new dust particles adhered in the oxidation furnace and during the operation of the step and, in the case of porous silicon subjected to only the conventional pure water rinse, they were added to the number of dust particles immediately after anodization.

Then the substrates were set on the carrier in the same method as described above and were immersed in diluted hydrofluoric acid. Then the pure-water over-flow high-frequency ultrasonic cleaning was carried out in the cleaning system (FIG. 17) of Example 1 for 20 minutes, eliminating the adhering bubbles by lifting the substrates together with the carrier 4 every five minutes (F in the drawing). As shown in FIG. 18, 54% to 80% of dust particles were removed, as compared with the data immediately after oxidation, and the number of dust particles was not more than 65 in either one of the porous silicon substrates.

This is considered to be a synergistic effect with the removing action to lift off dust particles from the surface in the oxide film exfoliation step. However, only the conventional, diluted hydrofluoric acid and pure water rinse results in detecting approximately several hundred dust particles, because the dust particles once lifted off re-adhere to the substrate because of the flowing-water charging of the hydrophobic substrate. Therefore, the above effect can be considered a result of the high-frequency ultrasonic cleaning effectively achieving removal of dust particles and prevention of re-adhesion thereof.

In addition, no anomaly was detected on the porous silicon surface after cleaning, as in Example 1.

Now described is the removing effect of adhering bubbles in the high-frequency cleaning in pure water carried out in Example 1 and Example 2.

Adsorption by bubbles is outstanding with fine dust particles and the collectively adhering state thereof to the substrate surface is outstanding. In the ultrasonic cleaning, however, generation of bubbles from dissolved gas in pure water is observed even in the high-frequency band as described previously. When the porous silicon substrate is further dried, bubbles are supposed to be generated because the gas (air) in the pores thereof are replaced with pure water to be discharged out of the pores. In order to clarify the origin of the bubbles adhering to the substrate surface, evaluation thereof was conducted by the dust particles not less than 0.2 μm on a hydrophobic bulk substrate surface without any porous structure formed therein.

Figure 19:
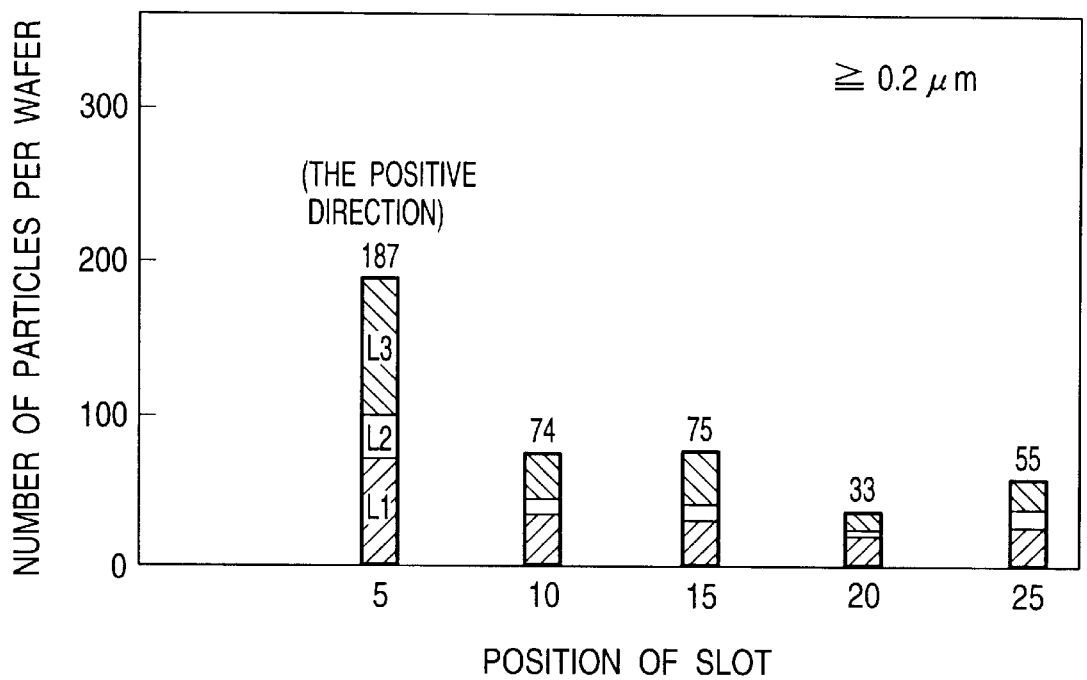
FIG. 19 is a graph to explain the bubble removing effect in the high-frequency cleaning of the present invention.

FIG. 19 is a drawing to show the result of the measurement of the number of dust particles conducted in such a way that bulk substrates were preliminarily cleaned by RCA cleaning to minimize the number of dust particles on the surface, immersed in diluted hydrofluoric acid, thereafter rinsed with pure water for 5 minutes, dried by spin drying, and then the number of dust particles was measured. It is apparent that the number of dust particles on the substrate at the carrier end is larger than those on the substrates at the other positions. This is considered to be due to inductive charging of the closest wafer induced by carrier charge, as is well known. Numbers indicating slot positions in the drawing represent slot numbers of the wafer carrier frequently used heretofore in the semiconductor industrial fields, and slots are formed at equal intervals of the pitch of 5 mm from 1 to 25 from the carrier end.

Figure 20:
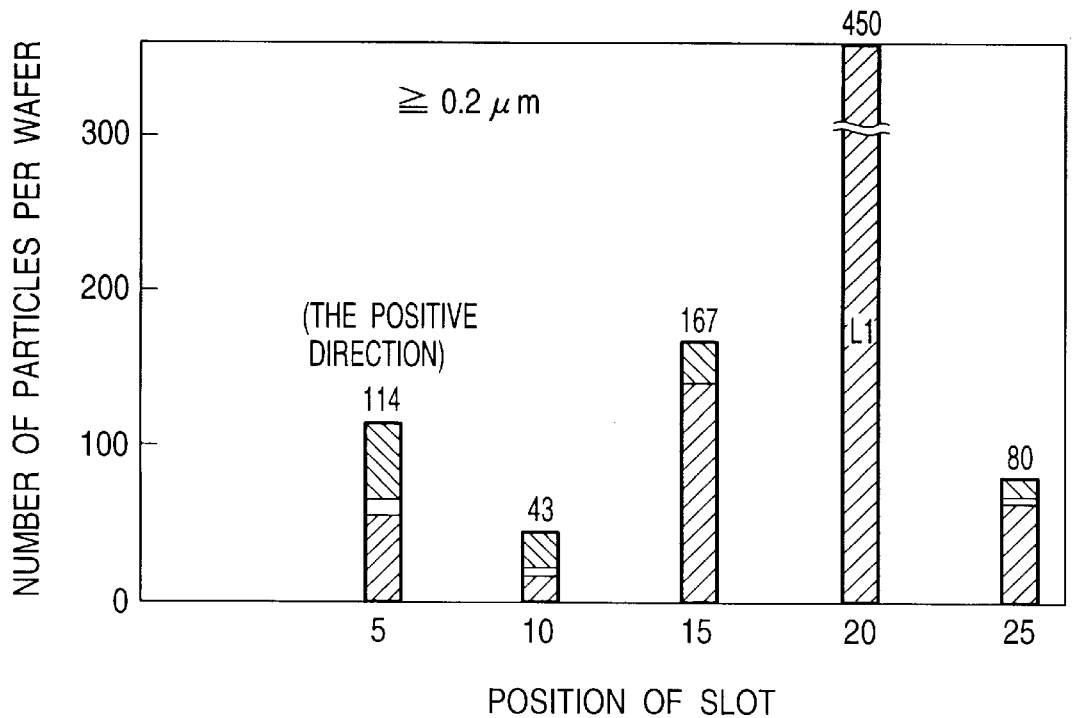
FIG. 20 is a graph to explain the bubble removing effect in the high-frequency cleaning of the present invention.

FIG. 20 is a drawing to show numbers of dust particles where the high-frequency cleaning of the frequency 1 MHz and the power 150 W was carried out in the above five-minute pure-water rinse step. As shown in FIG. 20, the high-frequency cleaning decreases the number of dust particles on the substrate, but, depending upon the slot position of the wafer carrier, some substrates show an extreme increase of fine dust particles (L1) on the contrary.

The increased dust particles aggregated densely in parallel to the bubble rise direction and the ultrasonic propagating direction from the slot position in the carrier and from the position distribution in the substrate.

This proves that simple ultrasonic cleaning in pure water results in contaminating the substrate with dust particles.

Figure 21:
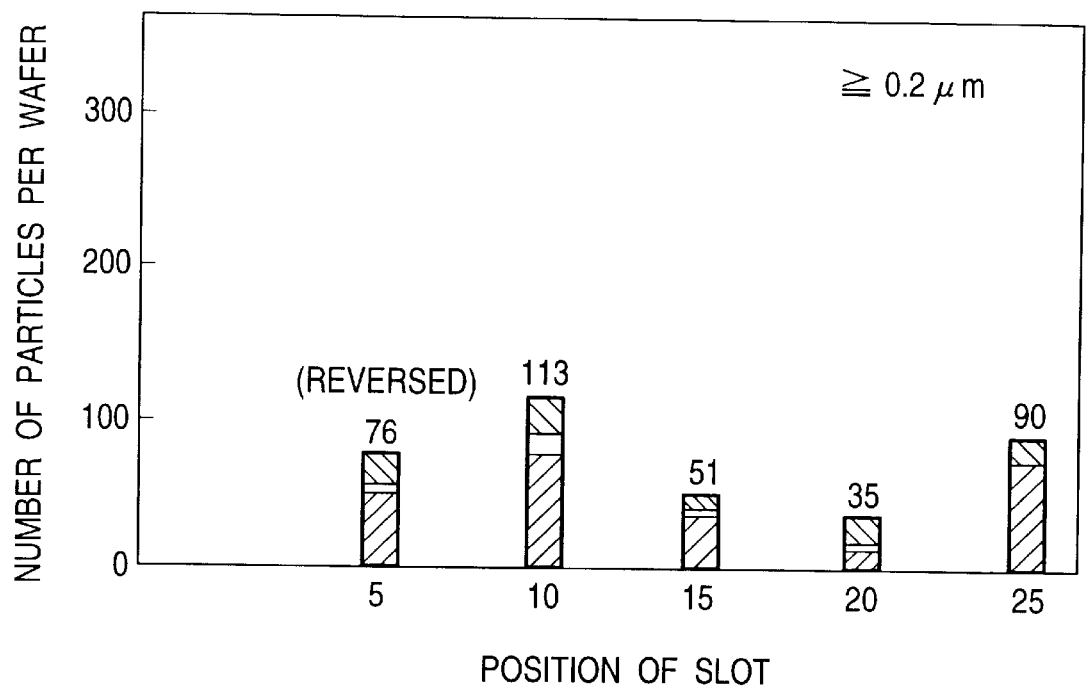
FIG. 21 is a graph to explain the bubble removing effect in the high-frequency cleaning of the present invention.

FIG. 21 is a drawing to show numbers of dust particles where only the dust particle measuring surface of the substrate at the carrier end was reversely set with respect to the carrier side, the other wafers in the carrier were normally set, and removal of bubbles was conducted by repeating the operation of lifting the substrates together with the carrier out of the high-frequency pure water bath every five minutes and again immersing them into the pure water for 20 minutes.

Although an effect by the cleaning time did exist, the removal of bubbles decreased the number of dust particles at each position in the carrier to the level equivalent to those with the pure-water rinse after RCA cleaning (FIG. 19), when compared with FIG. 20, and suppressed the aggregation of dust particles in the substrate.

It became clear from the above results that the cause of contamination of the substrate by dust particles was the generation of bubbles and adhesion thereof to the hydrophobic substrate surface due to the high-frequency ultrasonic wave from pure water.

From this, though the substrates were lifted up out of the pure water every five minutes in the above examples, the cleaning effect can be enhanced further by repeating the lift operation of the substrate every short time within the same cleaning period so as to further decrease the number of adhering bubbles in the cleaning period of time in pure water.

The dust particles on the reversed substrate at the carrier end also decreased similarly, and it will be clarified whether this is due to only the high-frequency cleaning or due to the synergistic effect with the reverse setting.

Bulk substrates each at the carrier end were normally and reversely set and were subjected to the RCA cleaning with the highest cleaning performance, and then the number of dust particles not less than 0.2 μm was counted on each substrate.

Figure 22:
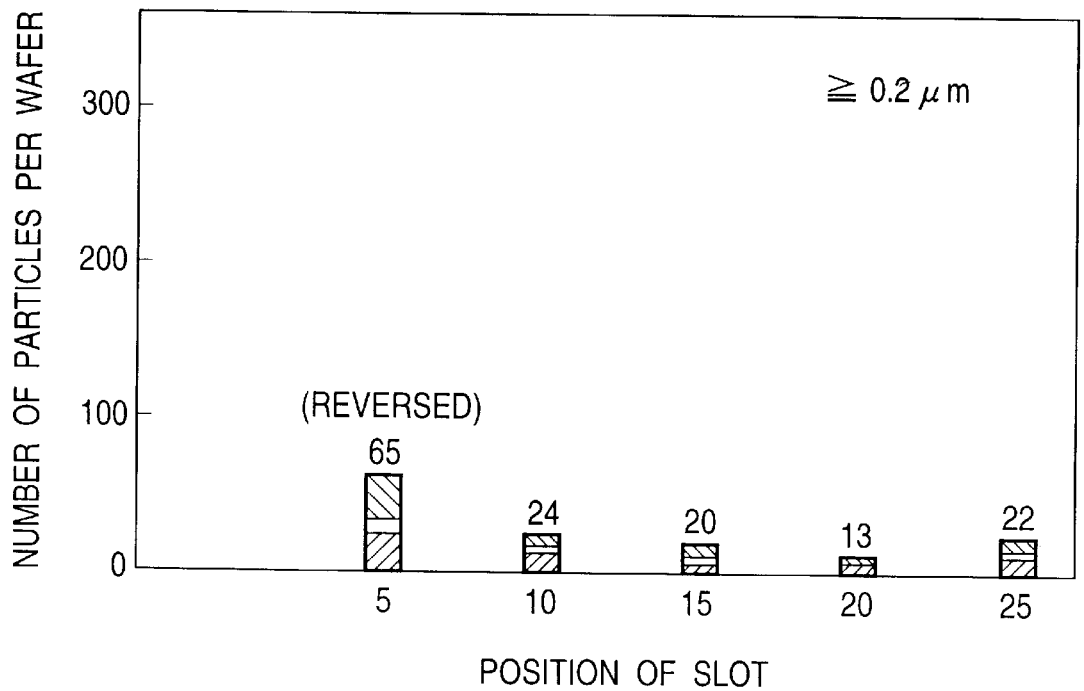
FIG. 22 is a graph to explain contamination of dust particles in a carrier for cleaning.
Figure 23:
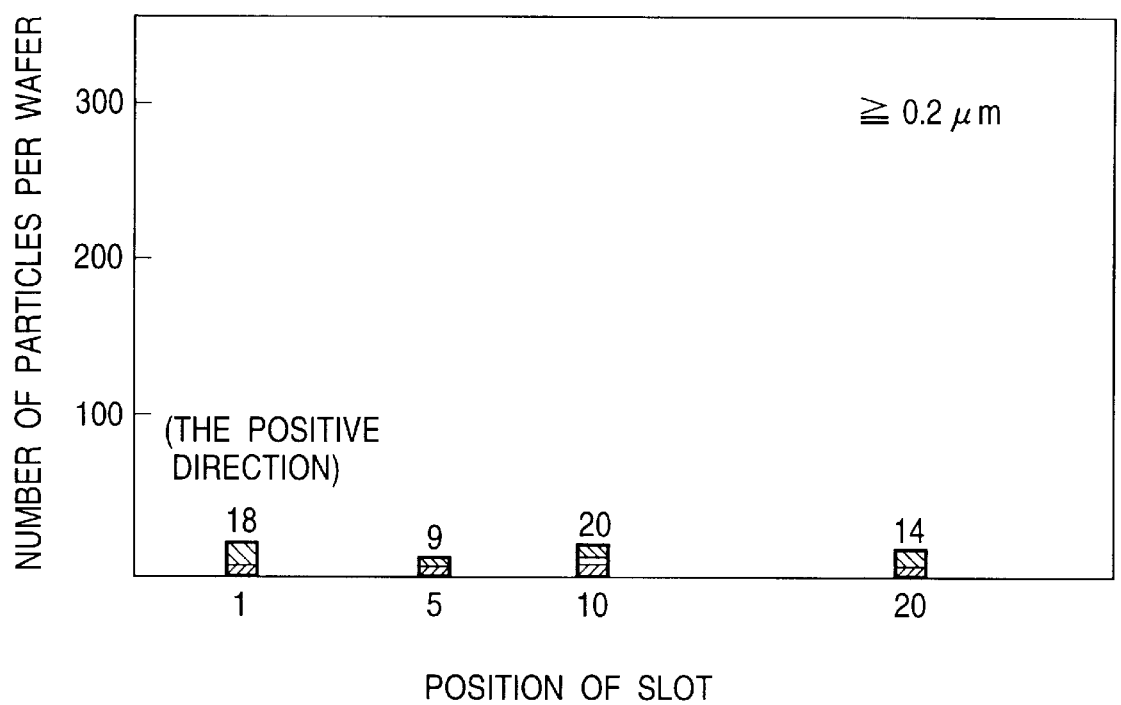
FIG. 23 is a graph to explain contamination of dust particles in the carrier for cleaning.
Figure 24:
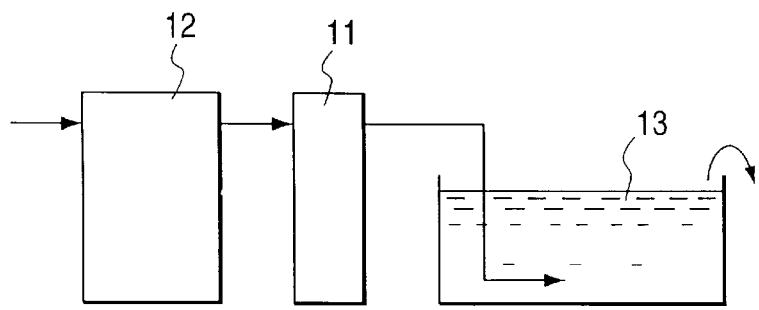
FIG. 24 is a conceptual drawing to show an example of the configuration of a high-frequency ultrasonic cleaning apparatus and deaerated pure water producing apparatus according to the present invention.

FIG. 22 shows the numbers of dust particles after cleaning in the normal state, and FIG. 23 shows the numbers of dust particles after cleaning which was conducted with the bulk substrate being set in the reverse state in the slot at the carrier end where the influence of inductive charging was greater from the carrier.

In the normal state the number of particles on the substrate at the carrier end is prominent as in the case of immersion in diluted hydrofluoric acid, but in the case of the reverse setting, the number is so small as to show little difference when compared with those of the other substrates.

From this, it is understood that the effect of prevention of adhesion by the setting method is also included in the decreased number of dust particles after the high-frequency cleaning of a reversely set substrate in FIG. 21.

As described, for carrying out the high-frequency cleaning in the batch-type bath, consideration should be given to the setting method of the substrate at the carrier end and the prevention of the adhesion of bubbles.

The above examples were described as specific examples using the batch-type cleaning apparatus, but it is noted that the cleaning effect of the present invention is not limited by the configuration of the apparatus.

Similarly, the conditions including the frequency and high-frequency power, the cleaning period of time, the temperature of liquid, etc. are just examples for verifying the cleaning effect of the present invention. The present invention is limited only by the frequency band (from 600 kHz to 2 MHz); the other conditions can be set arbitrarily.

Specifically, the examples of the present invention described examples where the high-frequency wave was superimposed on pure water, but, from the fact that the removing effect of organic matter and dust particles is well known where a small amount of surfactant, ozone, or the like is added to the pure water, methods in combination of these with the high-frequency cleaning of a porous silicon surface specific to the present invention can be readily achieved from the present invention.

Further, the above examples showed the examples of silicon semiconductor as a substrate material having the porous structure, but it is apparent in the above description that the object of the present invention is to clean the substrate having the fine, dense, fragile, porous structure in its cleaned surface. Thus, the cleaning method of the present invention can be applied to any substrates having a similar porous structure, and the invention is not limited by the substrate material.

Example 3

Examples 3 and 4 are examples of Embodiment 2. A film deaeration apparatus 11 in Example 3 is used connected midway of a pure water supply pipe between the conventional pure water producing apparatus 12 and the ultrasonic cleaning apparatus 13. The pure water produced by the film deaeration apparatus 11 is desirably released from the bottom part of the ultrasonic cleaning apparatus 13 in order to avoid take-in of air.

This permits the pure water of the concentration of dissolved gas being 5 ppm or less to be supplied to the ultrasonic cleaning apparatus 13.

Figure 27:
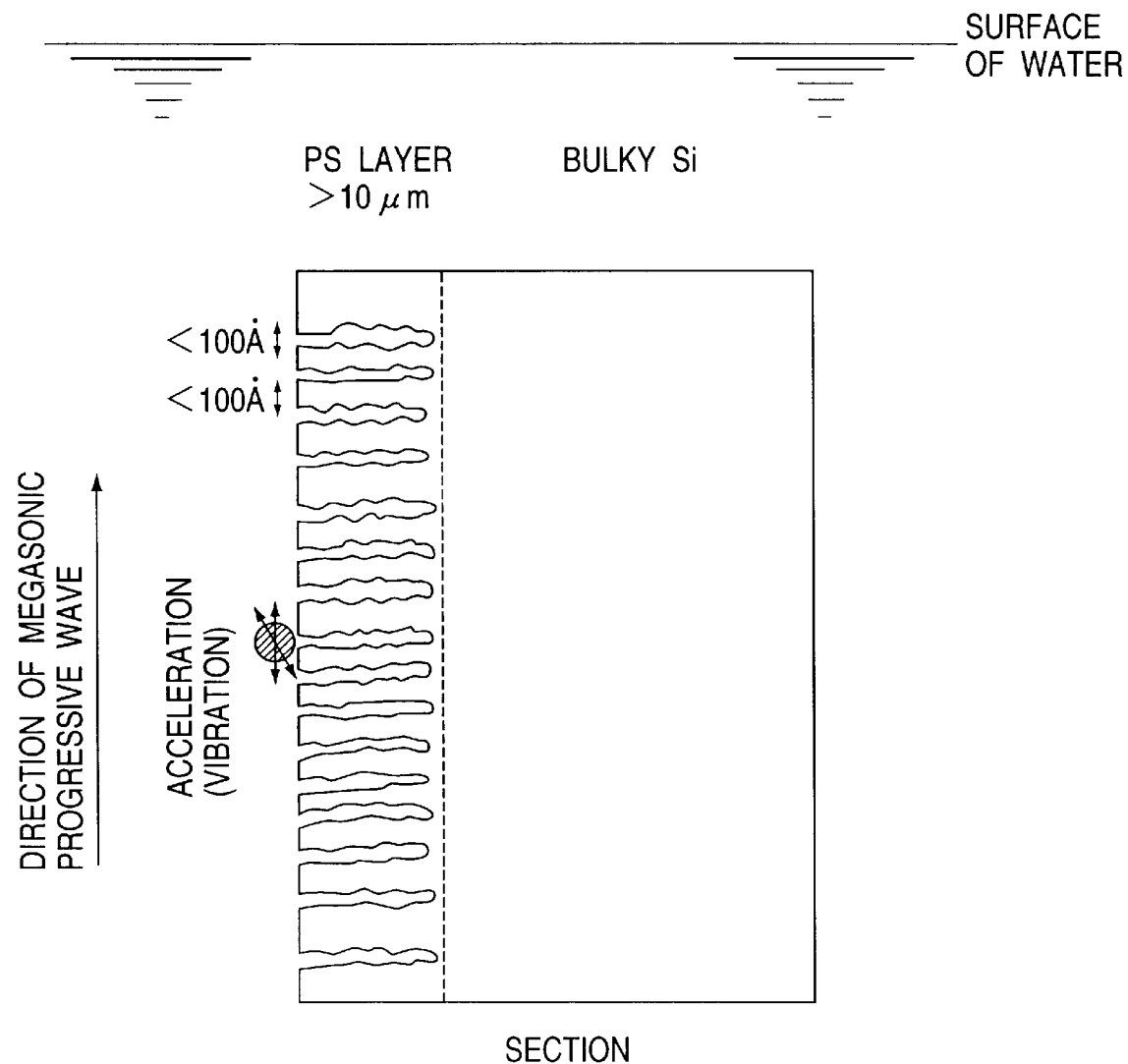
FIG. 27 is a drawing to schematically show the relationship between a porous silicon substrate and a high-frequency progressive wave.

Porous silicon substrates, each having a hydrophobic surface obtained by removing the surface native oxide film, were set on the cleaning carrier in a quartz bath under over flow of flowing water, using deaerated pure water, and the ultrasonic cleaning (the frequency 950 kHz) was conducted as applying the high-frequency ultrasonic wave of power 150 W in parallel to the substrate from the oscillator of the high-frequency ultrasonic bath through the quartz bath during immersion for 20 minutes. The cleaning was carried out only by immersion without performing the lift operation of the substrate. FIG. 27 schematically shows the relationship between the porous silicon substrate and the high-frequency progressive wave. The removing effect of dust particles adhering to the porous silicon substrate can be enhanced by placing the cleaned surface of a porous silicon substrate in parallel with the travel direction of the high-frequency progressive wave as shown.

With the deaerated pure water, generation of bubbles due to applikation of a high-frequency ultrasonic wave was not observed at all, and fixing of bubbles to the substrate surface was not observed.

Figure 25:
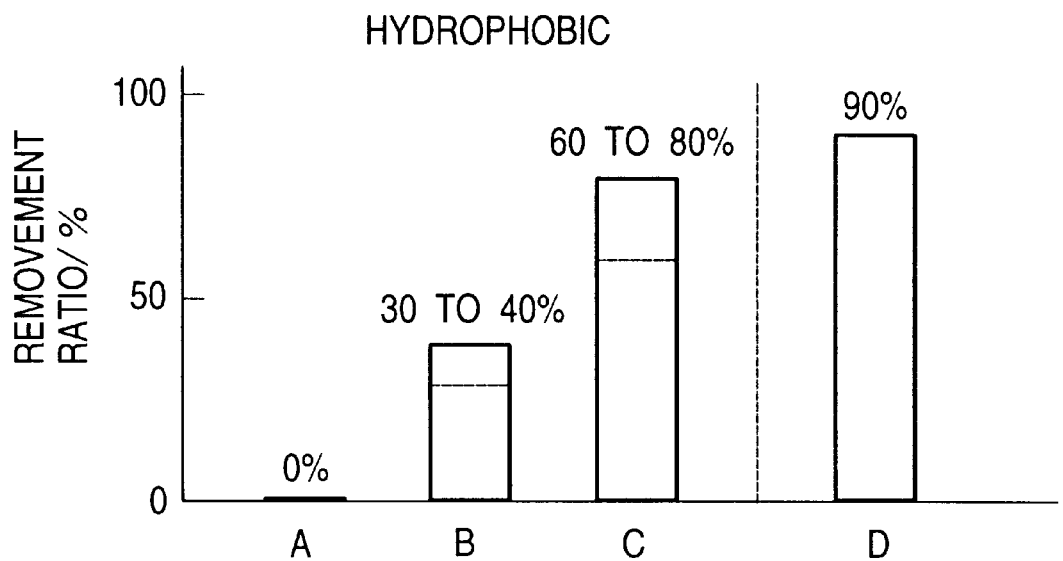
FIG. 25 is a graph to compare removal rates of dust particles between the high-frequency ultrasonic cleaning of the present invention applied to a surface of porous silicon having a hydrophobic and a cleaning method without deaeration.

FIG. 25 shows a comparison of dust particle removal rats for a porous surface among conventional high-frequency cleaning (case B) where cleaning was continued for 20 minutes under the same ultrasonic conditions by using non-deaerated pure water and performing the substrate lift operation every five minutes, the conventional case (case C) where the same cleaning was further continued for 20 minutes more (for 40 minutes in total), and the case (case A) where cleaning was conducted under the above cleaning conditions of the present invention for only immersion in deaerated pure water.

The removal rate by the 20-minute high-frequency cleaning of the present invention (case D) reaches 90%, which is better than the 40-minute cleaning (60 to 80%) by the high-frequency cleaning with non-deaerated pure water (where $N_2$ is in the saturation concentration) (case C).

Example 4

The cleaning effect of the present invention is by no means limited to the immersion cleaning of a substrate in the pure water bath like above Example 3.

Figure 26:
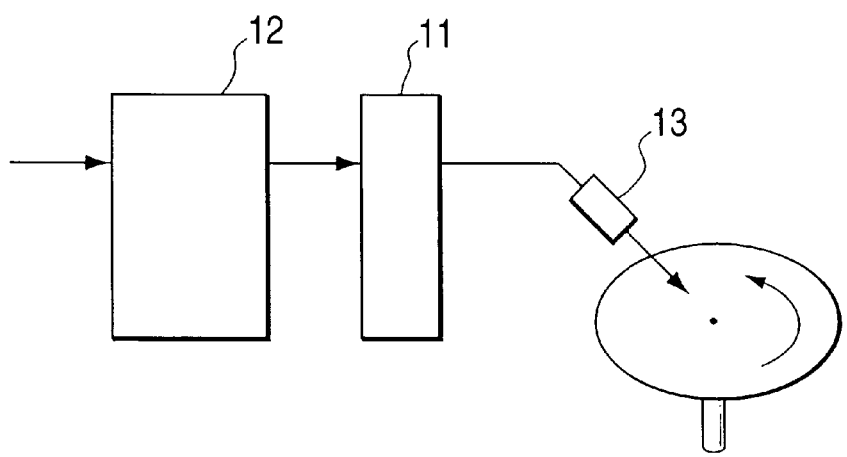
FIG. 26 is a conceptual drawing of an apparatus where the high-frequency ultrasonic cleaning of the present invention is applied to a cleaning apparatus of a shower type.

For example, in the case wherein spin cleaning as shown in FIG. 26 is carried out with blowing a shower of pure water on which the high-frequency ultrasonic wave is superimposed, against the surface of a rotating substrate as proposed previously, use of deaerated pure water as shown in FIG. 25 can prevent the generation of bubbles and can avoid the problem of impedance against propagation of ultrasonic waves due to the bubbles.

Example 5

Examples 5 to 8 are examples of Embodiment 3. The cleaning flow of Example 5 up to the epitaxial growth of porous silicon substrate is the same as the cleaning flow shown in FIG. 13. However, the cleaning steps $S_2$ and $S_3$ are omitted in this example. When a demand exists for a further decrease in the number of adhering dust particles, the cleaning steps $S_2$ and $S_3$ can be performed.

Since the surface is hydrophobic immediately after anodization, adhesion of bubbles to the substrate is avoided by carrying out the regular lift operation of the substrate during the high-frequency cleaning with pure water or the deaeration process of pure water. (In this example, the deaeration process of pure water was carried out.)

Cleaning was conducted to process one dummy substrate at the end of a polytetrafluoroethylene (Teflon) carrier for cleaning and twenty four porous silicon substrates together and was continued for 20 minutes under the conditions of the frequency of 950 kHz, the high-frequency power 150 W, the ordinary temperature, and over flow of flowing water with the substrates being kept immersed.

The pure water was one deaerated before the concentration of dissolved gas became 5 ppb or less (step $S_1$). This cleaning removed almost 90% of dust particles which have adhered in the anodization step.

The porous silicon surface thus cleaned is hydrophobic, but a native oxide film is formed thereon during the period of storage. Accordingly, immediately before the low-temperature oxidation process, the high-frequency cleaning with pure water and the exfoliation of the native oxide film with DHF were conducted again, and a thermal oxide film was formed in dry oxygen, at the low temperature of 400° C. and for one hour.

The surface after the low-temperature oxidation becomes hydrophilic, but approximately 100 dust particles newly adhere to the substrate surface during the oxidation step. Therefore, the high-frequency cleaning with pure water was carried out after the oxidation to remove the dust particles on the surface and to create a clean oxide film surface. The substrates were stored in a dedicated box.

Since the porous silicon surface after oxidation is hydrophilic, the countermeasure to prevent the bubbles from adhering to the substrate surface is unnecessary, and the substrates can be cleaned as immersed in the high-frequency cleaning bath with non-deaerated pure water.

The substrates were cleaned for 20 minutes under the cleaning conditions of the frequency of 950 kHz, the high-frequency power 150 W, the ordinary temperature, and immersion in the flowing water over-flow bath, using the non-deaerated pure water and keeping the substrates immersed.

This cleaning removed 90% of dust particles which have adhered in the oxidation step. Storage after oxidation and cleaning, even if long, raises no problem at all in applications of porous silicon, because it is covered by the oxide film.

The porous silicon substrates with the oxide film, having been stored, of the number that could be processed by the epitaxial growth system, were subjected to exfoliation removal of only the oxide film on the porous silicon surface with DHF immediately before being introduced into the epitaxial growth system. Then epitaxial growth was conducted.

At this time the epitaxial growth made a film with the surface of porous silicon as the origin, and therefore, the oxide film over the internal walls of holes of porous silicon were left in the etching step with DHF.

Two types of pure water used in the above high-frequency cleaning with pure water, deaerated and non-deaerated, were used depending upon the surface state of the substrate, but the deaerated pure water may be used for both the hydrophobic surface (after anodization) and the hydrophilic surface (after low-temperature oxidation), or the lift operation of the substrate (without deaeration) may be carried out.

Example 6

Next described is another cleaning method of a porous silicon substrate before the epitaxial growth.

FIG. 15 shows the cleaning flow of the present example. The high-frequency cleaning with deaerated pure water was carried out to clean the hydrophobic porous silicon surface after anodization in above Example 1, whereas in the present example the high-frequency cleaning was carried out under the same conditions using ozone is pure water in which ozone dissolved in approximately 10 to 13%.

The ozone pure water used herein was the one obtained by dissolving ozone gas, obtained from a wet type ozone producing system in combination of a hollow fiber filter with electrolysis of pure water, as is well known, in pure water.

The oxide film formed over the surface of porous silicon and the internal walls of holes by the ozone pure water after anodization is removed by etching with DHF immediately before the low-temperature oxidation step, similar to that heretofore.

Use of the ozone pure water requires the addition of new apparatus, but it is easier to control the concentration in the cleaning bath than deaeration of pure water.

In the present example, because the oxide film was already formed so as to be hydrophilic, the high-frequency cleaning was conducted using non-deaerated pure water as the high-frequency cleaning after the low-temperature oxidation, but no problem will arise even with the high-frequency cleaning using the ozone pure water (step $S_{12}$ of FIG. 15 can be performed under the same conditions as in step $S_{11}$), Example 7

Still another example of the present invention will be described.

The cleaning flow is the same as in Example 6, but it was modified, though not illustrated, to a method of high-frequency cleaning after the hydrophobic porous silicon surface after anodization was made hydrophilic with hydrogen peroxide solution ($H_2O_2/H_2O$) of a low concentration of approximately 2% or less diluted with pure water, instead of the high-frequency cleaning being carried out after the hydrophobic porous silicon surface after anodization has been changed to the hydrophilic surface with the ozone pure water.

The cleaning method demonstrated the cleaning effect even with keeping the substrate immersed, similarly as in use of the deaerated pure water or the ozone pure water.

In general, when chemicals are used, cleaning is carried out with the chemicals kept in the cleaning bath. However, the dust particles removed do not dissolve in the chemicals and stay in the bath in the cleaning method of the present invention.

Therefore, the pure water used in cleaning in the present example was subject to over flow of flowing water, the dust particles removed were discharged with water out of the cleaning bath, the diluted hydrogen peroxide solution thus discharged was guided through a filter for capturing particles of about 0.1 μm, then the hydrogen peroxide solution was recirculated to the cleaning bath, and the high-frequency cleaning was conducted as thus supplying the hydrogen peroxide solution. A certain amount of hydrogen peroxide was regularly replenished to compensate for consumption thereof.

Example 8

In general, cleaning in the cleaning bath is suitable for totally processing many substrates, but the recent demand for the further increase of substate size will increase the volume of the cleaning bath, i.e., increase the chemicals used.

In addition, considering many adhering dust particles after anodization, it is desirable to effectively discharge dust particles out of the bath, because use of the cleaning bath comes with the risk of re-contamination of the substrate by dust particles.

A method for solving this problem is a combination of the high-frequency cleaning with pure water according to the present invention with a single wafer type cleaning apparatus in combination of the well-known chemical shower with exhaust of chemicals by spinner.

The present invention is basically cleaning with pure water and has an advantage that cleaning can be made cheaper than chemical cleaning.

In addition, the single wafer type shower cleaning is suitable for cleaning of a porous silicon surface after anodization because of its process performance.

For cleaning the hydrophobic surface, the surface is made hydrophilic by oxidation before cleaning or by a shower of ozone water or diluted hydrogen peroxide solution and then the high-frequency cleaning is conducted, thereby effectively removing the dust particles adhering thereto.

As a matter of course, the high-frequency cleaning using the pure water shower can also be applied to cleaning of the porous silicon surface having the hydrophilic surface made by the low-temperature oxidation.

What is claimed is:

1. A cleaning method for a member having a porous surface comprising the steps of:

immersing the member having the porous surface in pure water, wherein the pure water is deaerated to provide a concentration of nitrogen dissolved in the pure water of 5 ppm or less; and applying a high-frequency wave ranging from 600 kHz to 2 MHz to the pure water in a progressive direction parallel to the porous surface of the member.

2. The cleaning method according to claim 1 further comprising the step of anodizing a member comprised of a non-porous material in a HF solution to make the surface of the member porous.

3. The cleaning method according to claim 1, wherein said pure water is deaerated to provide a concentration of oxygen dissolved in the pure water of 5 ppm or less.

4. The cleaning method according to claim 1, wherein said pure water is deaerated to provide a concentration of oxygen or carbon dioxide dissolved in the pure water of 5 ppm or less, respectively.

5. The cleaning method according to claim 1 further comprising the step of intermittently removing from the pure water said member having the porous surface.

6. A cleaning method for a member having a porous surface comprising the steps of:

anodizing a member comprised of a non-porous material in a HF solution to make the surface porous;

treating the porous surface of the member so as to make the porous surface hydrophilic;

immersing the member having the hydrophilic porous surface in pure water, wherein the pure water is deaerated to provide a concentration of nitrogen dissolved in the cure water of 5 ppm or less; and applying a high-frequency wave ranging from 600 kHz to 2 MHz to the pure water in a progressive direction parallel to the porous surface of the member.

7. The cleaning method according to claim 6, wherein said treating step includes forming an oxide film on said porous surface.

8. The cleaning method according to claim 6, wherein said treating step includes immersing said member having the porous surface in pure water containing ozone.

9. The cleaning method according to claim 6, wherein said treating step includes immersing said member having the porous surface in hydrogen peroxide solution.

* * * * *

UNITED STATES PATENT AND TRADEMARK OFFICE
CERTIFICATE OF CORRECTION

| | | |
|---|---|---|
| PATENT NO. | : | 6,058,945 |
| DATED | : | May 9, 2000 |
| INVENTOR(S) | : | YASUTOMO FUJIYAMA ET AL. |

Page 1 of 3

It is certified that error appears in the above-identified patent and that said Letters Patent is hereby corrected as shown below:

COLUMN 1:

Line 13, "porous" should read --a porous--.

COLUMN 2:

Line 17, "ten pm" should read --ten µm--;
    Line 43, "fragile will raise the" should be deleted;
          and "will" should be deleted;
    Line 44, "raise the" should be deleted; and
    Line 49, "porous" should read --a porous--.

COLUMN 3:

Line 18, "the" should be deleted;
    Line 19, "the" should be deleted; and
    Line 39, "sur face" should read --surface--.

COLUMN 8:

Line 31, "cleaning" should read --the cleaning--; and
    Line 59, "cleaning of" should be deleted.

COLUMN 9:

Line 51, "for" should read --to--.

COLUMN 14:

Line 6, "structure" should read --the structure--; and
    Line 17, "bath)," should read --the bath),--.

UNITED STATES PATENT AND TRADEMARK OFFICE
CERTIFICATE OF CORRECTION

PATENT NO. : 6,058,945

DATED : May 9, 2000

INVENTOR(S) : YASUTOMO FUJIYAMA ET AL.

It is certified that error appears in the above-identified patent and that said Letters Patent is hereby corrected as shown below:

COLUMN 15:

Line 34, "based" should read --based on--.

COLUMN 16:

Line 63, "deep-micron," should read --deep-micron order,--; and
Line 64, "film" should read --film.--.

COLUMN 17:

Line 18, "cleaning" should read --cleaning,--.

COLUMN 19:

Line 4, "waves" should read --waves,--.

COLUMN 21:

Line 33, "$S_2S_3$)" should read --$S_2,S_3$)--;
Line 51, "surface" should read --surface,--; and
Line 58, "epitaxially" should read --epitaxial--.

COLUMN 29:

Line 12, "dried" should read --and dried--.

COLUMN 30:

Line 65, "over" should read --over---.

UNITED STATES PATENT AND TRADEMARK OFFICE
CERTIFICATE OF CORRECTION

| | | |
|---|---|---|
| PATENT NO. | : | 6,058,945 |
| DATED | : | May 9, 2000 |
| INVENTOR(S) | : | YASUTOMO FUJIYAMA ET AL. |

Page 3 of 3

It is certified that error appears in the above-identified patent and that said Letters Patent is hereby corrected as shown below:

COLUMN 31:

Line 13, "applikation" should read --application--; and
Line 16, "rats" should read --rates--.

COLUMN 33:

Line 37, "over flow" should read --overflow--.

Signed and Sealed this

Twenty-second Day of May, 2001

Attest:

NICHOLAS P. GODICI

Attesting Officer

Acting Director of the United States Patent and Trademark Office